(12) United States Patent
Chen et al.

(10) Patent No.: US 9,871,465 B2
(45) Date of Patent: Jan. 16, 2018

(54) SEMICONDUCTOR DEVICE INCLUDING POSITIVE, NEGATIVE AND INTERMEDIATE POTENTIAL CONDUCTOR PLATES

(71) Applicant: FUJI ELECTRIC CO., LTD., Kawasaki (JP)

(72) Inventors: Shuangching Chen, Matsumoto (JP); Hiroaki Ichikawa, Azumino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 312 days.

(21) Appl. No.: 14/730,760

(22) Filed: Jun. 4, 2015

(65) Prior Publication Data
US 2015/0270786 A1   Sep. 24, 2015

Related U.S. Application Data

(63) Continuation of application No. PCT/JP2014/000087, filed on Jan. 10, 2014.

(30) Foreign Application Priority Data

Feb. 6, 2013   (JP) ................................. 2013-021849

(51) Int. Cl.
   *H02M 7/537*   (2006.01)
   *H02M 7/487*   (2007.01)
   *H02M 7/00*    (2006.01)

(52) U.S. Cl.
   CPC ........... *H02M 7/537* (2013.01); *H02M 7/003* (2013.01); *H02M 7/487* (2013.01)

(58) Field of Classification Search
   CPC ........ H02M 7/003; H02M 7/537; H02M 3/07; H02M 3/073; H02M 3/103; H01L 23/473; H01L 25/03
   (Continued)

(56) References Cited

U.S. PATENT DOCUMENTS 6,259,616 B1    7/2001  Ekwall et al.
2006/0274561 A1*  12/2006  Ahmed ................. H02M 7/003
                                            363/132
(Continued)

FOREIGN PATENT DOCUMENTS

JP    04071303 A    3/1992
JP    11089249 A    3/1999
(Continued)

OTHER PUBLICATIONS

International Search Report issued in PCT/JP2014/000087, dated Apr. 15, 2014. English translation provided.
Office Action issued in Japanese Appln. No. 2014-560659 dated Apr. 12, 2016. English translation provided.
Extended European Search Report issued in European Appln. No. 14748673.2 dated Feb. 23, 2017.

*Primary Examiner* — Yemane Mehari
(74) *Attorney, Agent, or Firm* — Rossi, Kimms & McDowell LLP

(57) ABSTRACT

A semiconductor device can include an insulating substrate on which at least four semiconductor elements forming a three-level power conversion circuit are mounted, a base plate on which the insulating substrate is provided, a positive conductor plate with a positive DC potential which is connected to one semiconductor element among the semiconductor elements; a negative conductor plate with a negative DC potential which is connected to another semiconductor element among the semiconductor elements and an intermediate potential conductor plate with an intermediate potential which is connected to the remaining two semiconductor elements among the semiconductor elements. The positive conductor plate, the negative conductor plate, and the intermediate potential conductor plate are provided on the base plate. The positive conductor plate and the negative conductor plate are arranged close to the intermediate potential conductor plate so as to face the intermediate potential conductor plate.

19 Claims, 23 Drawing Sheets

(58) Field of Classification Search
USPC .......... 363/59, 60, 120, 123, 131, 141, 144
See application file for complete search history.

(56) References Cited

U.S. PATENT DOCUMENTS

| | | |
|---|---|---|
| 2008/0217760 A1 | 9/2008 | Yoshihara et al. |
| 2009/0219696 A1* | 9/2009 | Nakayama ............ H02M 7/003 |
| | | 361/709 |
| 2010/0039843 A1 | 2/2010 | Takizawa |
| 2011/0222325 A1 | 9/2011 | Komatsu |
| 2012/0119256 A1 | 5/2012 | Okita |
| 2014/0169054 A1 | 6/2014 | Ogawa |
| 2014/0218991 A1* | 8/2014 | Chen .................... H02M 7/537 |
| | | 363/131 |

FOREIGN PATENT DOCUMENTS

| | | |
|---|---|---|
| JP | 2002526023 A | 8/2002 |
| JP | 2002368192 A | 12/2002 |
| JP | 2008193779 A | 8/2008 |
| JP | 2008252055 A | 10/2008 |
| JP | 2011193646 A | 9/2011 |
| JP | 2011254672 A | 12/2011 |
| JP | 2012110095 A | 6/2012 |
| WO | 0131771 A1 | 5/2001 |
| WO | 2012169521 A1 | 12/2012 |
| WO | 2013069415 A1 | 5/2013 |

* cited by examiner

| T1:IGBT SWITCHING | T3 | T3 | T3 | T4 | T4 | T4 |
|---|---|---|---|---|---|---|
| T4:RB-IGBT RECOVERY | T2 | T2 | T2 | T1 | T1 | T1 |

FIG.11A

| T2:IGBT SWITCHING | T3 | T3 | T3 | T4 | T4 | T4 |
|---|---|---|---|---|---|---|
| T3:RG-IGBT RECOVERY | T2 | T2 | T2 | T1 | T1 | T1 |

FIG.11B

| T3:RB-IGBT SWITCHING | T3 | T3 | T3 | T4 | T4 | T4 |
|---|---|---|---|---|---|---|
| T1:FWD RECOVERY | T2 | T2 | T2 | T1 | T1 | T1 |

FIG.11C

| T4:RG-IGBT SWITCHING | T3 | T3 | T3 | T4 | T4 | T4 |
|---|---|---|---|---|---|---|
| T2:FWD RECOVERY | T2 | T2 | T2 | T1 | T1 | T1 |

FIG.11D

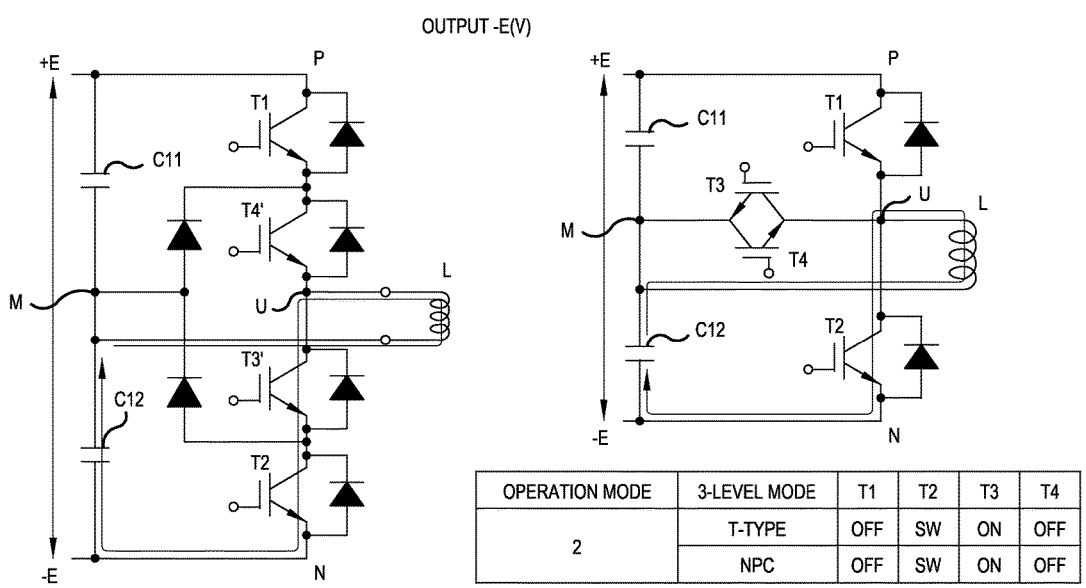

| T1:IGBT SWITCHING | T2 | T2 | T2 | T3 | T3 | T3 |
| T4:RB-IGBT RECOVERY | T4 | T4 | T4 | T1 | T1 | T1 |

FIG.18A

| T2:IGBT SWITCHING | T2 | T2 | T2 | T3 | T3 | T3 |
| T3:RB-IGBT RECOVERY | T4 | T4 | T4 | T1 | T1 | T1 |

FIG.18B

| T3:RB-IGBT SWITCHING | T2 | T2 | T2 | T3 | T3 | T3 |
| T1:FWD RECOVERY | T4 | T4 | T4 | T1 | T1 | T1 |

FIG.18C

| T4:RB-IGBT SWITCHING | T2 | T2 | T2 | T3 | T3 | T3 |
| T2:FWD RECOVERY | T4 | T4 | T4 | T1 | T1 | T1 |

FIG.18D

| T1:IGBT SWITCHING | T2 | T2 | T2 | T4 | T4 | T4 |
|---|---|---|---|---|---|---|
| T4:RB-IGBT RECOVERY | T3 | T3 | T3 | T1 | T1 | T1 |

FIG.20A

| T2:IGBT SWITCHING | T2 | T2 | T2 | T4 | T4 | T4 |
|---|---|---|---|---|---|---|
| T3:RB-IGBT RECOVERY | T3 | T3 | T3 | T1 | T1 | T1 |

FIG.20B

| T3:RB-IGBT SWITCHING | T2 | T2 | T2 | T4 | T4 | T4 |
|---|---|---|---|---|---|---|
| T1:FWD RECOVERY | T3 | T3 | T3 | T1 | T1 | T1 |

FIG.20C

| T4:RB-IGBT SWITCHING | T2 | T2 | T2 | T4 | T4 | T4 |
|---|---|---|---|---|---|---|
| T2:FWD RECOVER | T3 | T3 | T3 | T1 | T1 | T1 |

FIG.20D

T1:IGBT SWITCHING
T4:RB-IGBT RECOVERY

| T4 | T3 | T4 | T3 | T4 | T3 |
|----|----|----|----|----|----|
| T2 | T1 | T2 | T1 | T2 | T1 |

FIG.22A

T2:IGBT SWITCHING
T3:RB-IGBT RECOVERY

| T4 | T3 | T4 | T3 | T4 | T3 |
|----|----|----|----|----|----|
| T2 | T1 | T2 | T1 | T2 | T1 |

FIG.22B

T3:RB-IGBT SWITCHING
T1:FWD RECOVERY

| T4 | T3 | T4 | T3 | T4 | T3 |
|----|----|----|----|----|----|
| T2 | T1 | T2 | T1 | T2 | T1 |

FIG.22C

T4:RB-IGBT SWITCHING
T2:FWD RECOVERY

| T4 | T3 | T4 | T3 | T4 | T3 |
|----|----|----|----|----|----|
| T2 | T1 | T2 | T1 | T2 | T1 |

FIG.22D

| T1:IGBT SWITCHING | T2 | T3 | T2 | T3 | T2 | T3 |
| --- | --- | --- | --- | --- | --- | --- |
| T4:RB-IGBT RECOVERY | *T4* | *T1* | *T4* | *T1* | *T4* | *T1* |

FIG.24A

| T2:IGBT SWITCHING | *T2* | *T3* | *T2* | *T3* | *T2* | *T3* |
| --- | --- | --- | --- | --- | --- | --- |
| T3:RB-IGBT RECOVERY | T4 | T1 | T4 | T1 | T4 | T1 |

FIG.24B

| T3:RB-IGBT SWITCHING | T2 | *T3* | T2 | *T3* | T2 | *T3* |
| --- | --- | --- | --- | --- | --- | --- |
| T1:FWD RECOVERY | T4 | *T1* | T4 | *T1* | T4 | *T1* |

FIG.24C

| T4:RB-IGBT SWITCHING | *T2* | T3 | *T2* | T3 | *T2* | T3 |
| --- | --- | --- | --- | --- | --- | --- |
| T2:FWD RECOVERY | *T4* | T1 | *T4* | T1 | *T4* | T1 |

FIG.24D

SEMICONDUCTOR DEVICE INCLUDING POSITIVE, NEGATIVE AND INTERMEDIATE POTENTIAL CONDUCTOR PLATES

CROSS-REFERENCE TO RELATED APPLICATIONS

This application is a continuation of International Application No. PCT/JP2014/000087, filed on Jan. 10, 2014, which is based on and claims priority to Japanese Patent Application No. JP 2013-021849, filed on Feb. 6, 2013. The disclosure of the Japanese priority application and the PCT application in their entirety, including the drawings, claims, and the specification thereof, are incorporated herein by reference.

BACKGROUND

1. Field of the Invention

The present invention relates to a semiconductor device that is used in, for example, a power conversion device which includes a power device and converts DC power into AC power.

2. Related Art

A power conversion device has been widely used in a power conditioner (power conditioning subsystem: PCS) with a function of converting power generated by a power generation unit, such as a solar cell, a fuel cell, or a gas engine, into system power or an uninterrupted power supply (UPS).

A semiconductor module obtained by mounting a power device, such as an insulated gate bipolar transistor (IGBT) or a free wheeling diode (FWD), on an insulating substrate and storing the insulating substrate in a resin case has been used in the power conversion device.

For example, Japanese Patent Application Publication No. JP 2012-110095 A (also referred to herein as "Patent Document 1") discloses a power semiconductor module as an example of the semiconductor module used in this type of power conversion device.

In the power semiconductor module, a circuit corresponding to one phase of a three-level inverter circuit is stored in the case. In the three-level inverter circuit, wiring is performed such that one of a U terminal and an M terminal to which a current flows in the opposite direction is arranged close to the other terminal, thereby reducing inductance in the case.

Japanese Patent Application Publication No. JP 2011-254672 A (also referred to herein as "Patent Document 2") discloses a power semiconductor module as another example of the module according to the related art. In the power semiconductor module, when a three-level inverter has the same structure as the three-level inverter disclosed in Patent Document 1, among external terminals P, M, N, and U, the terminal M is divided into terminals M1 and M2 and the terminals are linearly arranged in order of the terminals M1, P, N, M2, and U or in order of the terminals M1, N, P, M2, and U. According to this structure, it is possible to prevent an increase in bouncing voltage due to the influence of wiring inductance when the operation mode of the inverter is changed from a three-level mode to a two-level mode.

Japanese Patent Application Publication No. JP 2008-193779 A (also referred to herein as "Patent Document 3") discloses a semiconductor module as still another example of the module according to the related art. In the semiconductor module, a series connection circuit of IGBTs which are connected between a P terminal and an N terminal of a DC power supply and an AC switching element which is connected between a connection point of the series connection circuit and a neutral point of the DC power supply are put into one package. Therefore, it is possible to reduce wiring inductance and to reduce the costs of the device. As a technique for forming the three-level inverter, the following techniques have been disclosed: a technique in which IGBTs that are connected in inverse parallel to two diodes are connected in series to each other to form a bidirectional switch; and a technique in which two reverse blocking IGBTs are connected in inverse parallel to each other to form a bidirectional switch. The reverse blocking IGBT is an IGBT with reverse breakdown voltage characteristics.

Japanese Patent Application Publication No. JP 2011-193646 A (also referred to herein as "Patent Document 4") discloses a semiconductor device as yet another example of the module according to the related art. The semiconductor device includes a series connection circuit of IGBTs which are connected between a P terminal and an N terminal of a DC power supply of a three-level inverter circuit and an intermediate terminal that is provided at a connection point between first and second IGBTs to which diodes are connected in inverse parallel and which are connected in series to each other between a connection point of the series connection circuit and a neutral point of the DC power supply. According to this structure, it is possible to perform an insulation test for a semiconductor device while preventing the IGBTs or the diodes from being broken.

Japanese Patent Application Publication No. JP 2002-368192 A (also referred to herein as "Patent Document 5") discloses a semiconductor device as still yet another example of the module according to the related art. The semiconductor device is a high-capacity semiconductor device that is used in a device, for example, an inverter. In the semiconductor device, three IGBT chips are provided on an insulating substrate and are arranged in a zigzag pattern so as to be connected in parallel.

However, in the above-mentioned Patent Document 1, wiring is performed such that the U terminal and the M terminal overlap each other. Therefore, it is possible to reduce inductance in the case. In the above-mentioned Patent Document 2, the terminal P is close to the terminal N, the terminal P is adjacent to the terminal M1, and the terminal N is adjacent to the terminal M2. However, there is an unsolved problem that the overlap width between the terminals is narrow and it is difficult to sufficiently reduce inductance.

The above-mentioned Patent Document 3 discloses a structure in which it is easy to arrange a P-C1 line and an M line so as to be close to each other and to arrange the M line and an N-E2 line so as to be close to each other. However, the width of a portion of the M line which faces the P-C1 line and the N-E2 line is small and it is difficult to sufficiently reduce inductance.

The above-mentioned Patent Documents 4 and 5 do not disclose a technique for reducing inductance, but disclose only the structure of the three-level inverter circuit.

SUMMARY OF THE INVENTION

Accordingly, the invention has been made in view of the above-mentioned unsolved problems of the related art and an object of the invention is to provide a semiconductor device in which an intermediate potential conductor plate faces a positive conductor plate and a negative conductor plate in order to reliably reduce inductance.

Means for Solving Problem

In order to achieve the above-mentioned object, according to a first aspect of the invention, a semiconductor device includes: an insulating substrate on which at least four semiconductor elements forming a three-level power conversion circuit are mounted; a base plate on which the insulating substrate is arranged; a positive conductor plate with a positive DC potential that is connected to one semiconductor element among the semiconductor elements; a negative conductor plate with a negative DC potential that is connected to another semiconductor element among the semiconductor elements; and an intermediate potential conductor plate with an intermediate potential that is connected to the remaining two semiconductor elements among the semiconductor elements. The positive conductor plate, the negative conductor plate, and the intermediate potential conductor plate are provided on the base plate. The positive conductor plate and the negative conductor plate are arranged close to the intermediate potential conductor plate so as to face the intermediate potential conductor plate.

According to the invention, the positive conductor plate and the negative conductor plate are arranged on the insulating substrate, on which at least four semiconductor elements forming the three-level power conversion circuit are mounted, so as to face the intermediate potential conductor plate. Therefore, it is possible to increase the overlap area between the intermediate potential conductor plate and the positive and negative conductor plates to which a current flows in the opposite direction and to significantly reduce inductance.

BRIEF DESCRIPTION OF DRAWINGS

FIGS. 11A-11D are diagrams schematically illustrating the heat generating state of the semiconductor elements in each operation mode of the semiconductor device according to the second embodiment of the invention;

FIGS. 15A and 15B are diagrams illustrating comparison between a current path in the circuit structure illustrated in FIG. 12A and a current path in the circuit structure illustrated in FIG. 13A when a negative voltage is output in the second embodiment;

FIGS. 18A-18D are diagrams schematically illustrating the heat generating state of the semiconductor elements in each operation mode of the semiconductor device according to the third embodiment of the invention;

FIGS. 20A-20D are diagrams schematically illustrating the heat generating state of the semiconductor elements in each operation mode in the modification of the semiconductor device according to the third embodiment of the invention;

FIGS. 22A-22D are diagrams schematically illustrating the heat generating state of the semiconductor elements in each operation mode of the semiconductor device according to the fourth embodiment of the invention;

FIGS. 24A-24D are diagrams schematically illustrating the heat generating state of the semiconductor elements in each operation mode in the modification of the semiconductor device according to the fourth embodiment of the invention;

DETAILED DESCRIPTION

Figure 1:
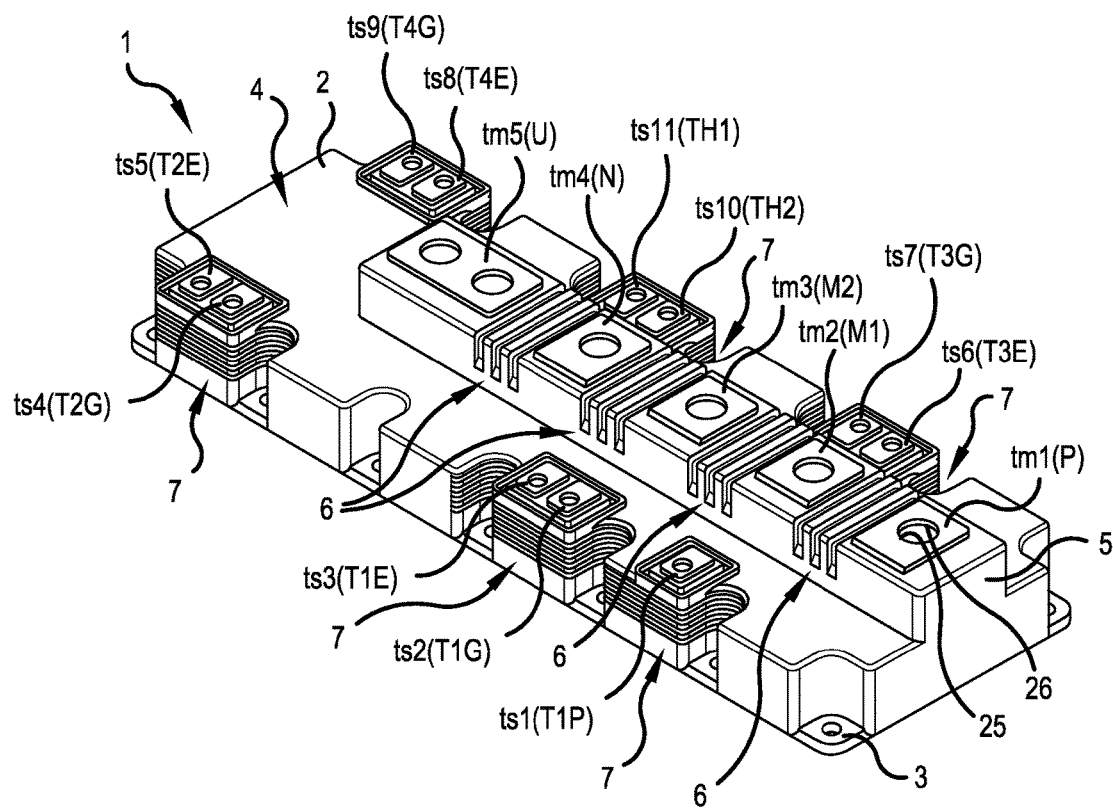
FIG. 1 is a perspective view illustrating a semiconductor device according to a first embodiment of the invention.
Figure 2:
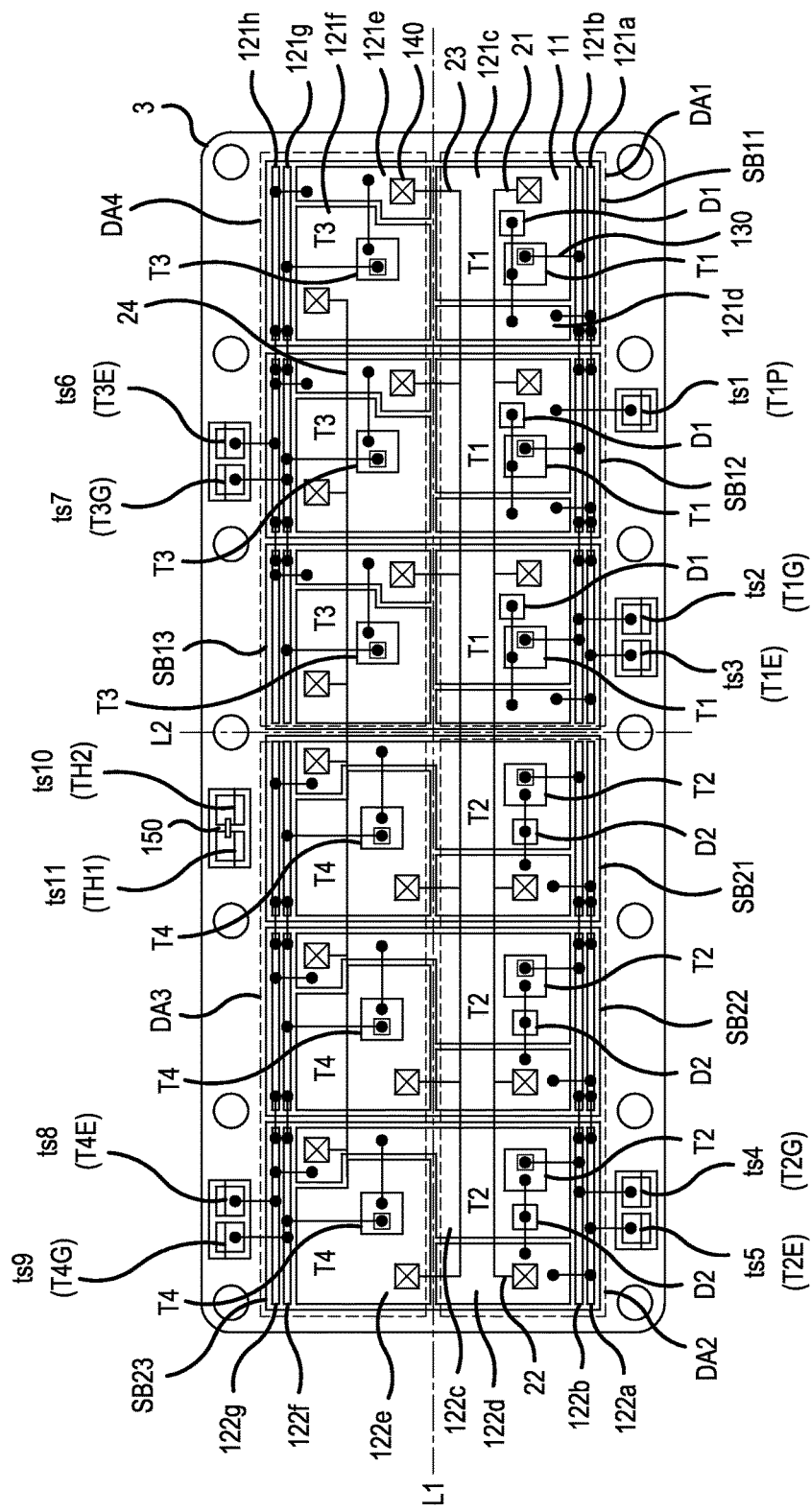
FIG. 2 is a plan view illustrating semiconductor elements mounted on insulating substrates which are bonded to a base plate of the semiconductor device illustrated in FIG. 1.

Hereinafter, embodiments of the invention will be described with reference to the drawings. FIG. 1 is a perspective view illustrating a semiconductor device according to a first embodiment of the invention. FIG. 2 is a plan view illustrating semiconductor elements which are mounted on insulating substrates bonded to a base plate of the semiconductor device illustrated in FIG. 1. The semiconductor device illustrated in FIG. 1 can be applied to a power conditioner (power conditioning subsystem: PCS).

A semiconductor device 1 includes a case 2 which is molded with an insulating resin, as illustrated in FIG. 1. The case 2 is formed such that holes which are provided in a base plate 3 in order to fix the base plate 3 with screws are exposed. In addition, the case 2 covers other portions of the base plate 3. A terminal arrangement surface 4 is formed on the upper surface side of the case 2. A protrusion 5 is provided in a central portion of the terminal arrangement surface 4 in the lateral direction so as to extend in the longitudinal direction of the terminal arrangement surface 4. A first external connection terminal tm1(P) which is a positive terminal P of a DC power supply, a second external connection terminal tm2(M1) and a third external connection terminal tm3(M2) which are intermediate terminals, a fourth external connection terminal tm4(N) which is a negative terminal N of the DC power supply, and a fifth external connection terminal tm5(U) which is an AC output terminal U are linearly arranged in series on the protrusion 5 in this order from the right end of the protrusion 5.

The following auxiliary terminals are sequentially arranged at the leading end of the terminal arrangement surface 4 from the right side: a first auxiliary terminal ts1(T1P) that outputs a collector voltage of an insulated gate bipolar transistor T1 which will be described below; a second auxiliary terminal ts2(T1G) which is a gate terminal for supplying a gate voltage of the insulated gate bipolar transistor T1; a third auxiliary terminal ts3(T1E) that outputs an emitter voltage of the insulated gate bipolar transistor T1 which will be described below; a fourth auxiliary terminal ts4(T2G) that is a gate terminal for supplying a gate voltage of an insulated gate bipolar transistor T2 which will be described below; and a fifth auxiliary terminal ts5(T2E) that outputs an emitter voltage of the insulated gate bipolar transistor T2.

A sixth auxiliary terminal ts6(T3E) that outputs an emitter voltage of an insulated gate bipolar transistor T3, which will be described below, and a seventh auxiliary terminal ts7(T3G) that is a gate terminal for supplying a gate voltage of the insulated gate bipolar transistor T3 are provided side by side at the rear end of the terminal arrangement surface 4 so as to lean to the right end. In addition, an eighth auxiliary terminal ts8(T4E) that outputs an emitter voltage of an insulated gate bipolar transistor T4, which will be described below, and a ninth auxiliary terminal ts9(T4G) that is a gate terminal for supplying a gate voltage of the insulated gate bipolar transistor T4 are provided side by side in the rear end of the terminal arrangement surface 4 so as to lean to the left end. Furthermore, tenth and eleventh auxiliary terminals ts10(TH2) and ts11(TH1) for a thermistor, which are connected to a thermistor 150 that is provided in the case 2 and detects the internal temperature of the case 2, are provided in a central portion of the rear end of the terminal arrangement surface 4.

The protrusion 5 of the case 2 includes a plurality lateral slits which are formed in a portion between the first and second external connection terminals tm1 and tm2, a portion between the second and third external connection terminals tm2 and tm3, a portion between the third and fourth external connection terminals tm3 and tm4, and a portion the fourth and fifth external connection terminals tm4 and tm5. Such slits 6 are formed to increase the creepage distance of each of the above-mentioned portions in order to ensure the insulation of each of the portions.

The case 2 includes a plurality of slits 7 which are formed in portions below the first auxiliary terminal ts1 to the eleventh auxiliary terminal ts11, similarly to the slits 6. The slits 7 are formed to increase the creepage distances of portions between the auxiliary terminals ts1 to ts11 and the base plate 3 (ground potential) in order to ensure the insulation of each of the portions. Here, the number of the slits 6 and 7 may be set depending on a desired breakdown voltage.

As illustrated in FIG. 2, an insulating substrate 11 in which conductor patterns are formed on both surfaces of a ceramic (for example, alumina) substrate with high thermal conductivity is provided on the base plate 3. In the example illustrated in FIG. 2, six insulating substrates 11 are provided on the base plate 3. Four insulated gate bipolar transistors T1 to T4 which form a circuit corresponding to one phase illustrated in FIG. 3 among three phases of a three-level power conversion device (inverter) circuit are mounted on every two insulating substrates 11 among the six insulating substrates 11. Among the four insulated gate bipolar transistors T1 to T4, the insulated gate bipolar transistors T1 and T3 are mounted on the same insulating substrate 11 and the insulated gate bipolar transistors T2 and T4 are mounted on the same insulating substrate 11. Among the insulated gate bipolar transistors T1 to T4, the insulated gate bipolar transistors T3 and T4 are reverse blocking insulated gate bipolar transistors.

In the example illustrated in FIG. 2, for three insulating substrates 11 (represented by SB11 to SB13) having the insulated gate bipolar transistors T1 and T3 mounted thereon and three insulating substrates 11 (represented by SB21 to SB23) having the insulated gate bipolar transistors T2 and T4 mounted thereon, the insulating substrates SB11 to SB13 are connected in parallel to each other and the insulating substrates SB21 to SB23 are connected in parallel to each other.

The entire internal area of the case 2 on the base plate 3 is divided into four areas by a central line L1 in the longitudinal direction and a central line L2 in the lateral direction illustrated in FIG. 2. As illustrated in FIG. 2, the four divided areas are referred to as areas DA1, DA2, DA3, and DA4.

In the example illustrated in FIG. 2, the insulated gate bipolar transistor T1 as a semiconductor element, which will be described below, and a free wheeling diode D1 which is connected in inverse parallel to the insulated gate bipolar transistor T1 are arranged in the area DA1. That is, the insulated gate bipolar transistor T1 and the free wheeling diode D1 which is connected in inverse parallel to the insulated gate bipolar transistor T1 are mounted on each of the insulating substrates SB11 to SB13 in the area DA1. In addition, the insulated gate bipolar transistors T1 and the free wheeling diodes D1 are linearly arranged in the longitudinal direction of the base plate 3.

The insulated gate bipolar transistor T2 as a semiconductor element, which will be described below, and a free wheeling diode D2 which is connected in inverse parallel to the insulated gate bipolar transistor T2 are arranged in the area DA2. That is, the insulated gate bipolar transistor T2 and the free wheeling diode D2 which is connected in inverse parallel to the insulated gate bipolar transistor T2 are mounted on each of the insulating substrates SB21 to SB23 in the area DA2. In addition, the insulated gate bipolar transistors T2 and the free wheeling diodes D2 are linearly arranged in the longitudinal direction of the base plate 3.

The reverse blocking insulated gate bipolar transistor T3 as a semiconductor element that is a bidirectional switching element, which will be described below, is provided in the area DA3. That is, the reverse blocking insulated gate bipolar transistor T3 is mounted on each of the insulating substrates SB21 to SB23 in the area DA3. The reverse blocking insulated gate bipolar transistors T3 are linearly arranged in the longitudinal direction of the base plate 3.

The reverse blocking insulated gate bipolar transistor T4 as a semiconductor element that is a bidirectional switching element, which will be described below, is provided in the area DA4. That is, the reverse blocking insulated gate bipolar transistor T4 is mounted on each of the insulating substrates SB11 to SB13 in the area DA4. The reverse blocking insulated gate bipolar transistors T4 are linearly arranged in the longitudinal direction of the base plate 3.

Figure 3:
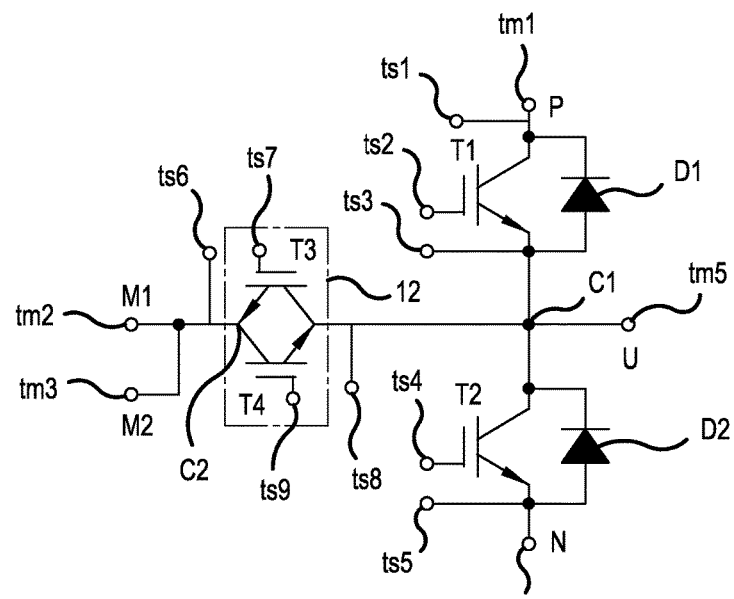
FIG. 3 is a circuit diagram illustrating an example of a three-level power conversion circuit.

Here, as illustrated in FIG. 3, the structure of the three-level power conversion (inverter) circuit provided in the semiconductor device 1, for example, a circuit structure corresponding to the U-phase includes the insulated gate bipolar transistors T1 and T2 which are connected in series to each other and a bidirectional switching element 12 which is connected to a connection point C1 between the emitter of the insulated gate bipolar transistor T1 and the collector of the insulated gate bipolar transistor T2.

The bidirectional switching element 12 includes the reverse blocking insulated gate bipolar transistor T3 having a collector connected to the connection point C1 and the reverse blocking insulated gate bipolar transistor T4 which is connected in inverse parallel to the reverse blocking insulated gate bipolar transistor T3.

A conductive pattern 121$a$ and a conductive pattern 121$b$ are provided at one end of each of the insulating substrates SB11 to SB13. The conductive pattern 121$a$ is electrically connected to the third auxiliary terminal ts3(T1E) which outputs the emitter voltage of the insulated gate bipolar transistor T1. The conductive pattern 121$b$ is electrically connected to the second auxiliary terminal ts2(T1G) which is a gate terminal for supplying the gate voltage of the insulated gate bipolar transistor T1.

A conductive pattern 121$h$ and a conductive pattern 121$g$ are provided at the other ends of the insulating substrates SB11 to SB13. The conductive pattern 121$h$ is electrically connected to the sixth auxiliary terminal ts6(T3E) which outputs the emitter voltage of the reverse blocking insulated gate bipolar transistor T3. The conductive pattern 121$g$ is electrically connected to the seventh auxiliary terminal ts7(T3G) which is a gate terminal for supplying the gate voltage of the reverse blocking insulated gate bipolar transistor T3.

Each of the insulating substrates SB11 to SB13 includes a conductive pattern 121$c$ and a conductive pattern 121$d$ that are provided in the area DA1 in which the insulated gate bipolar transistors T1 are mounted. The conductive pattern 121$c$ connects the collector of the insulated gate bipolar transistor T1 and a cathode of the free wheeling diode D1 through solder including tin or conductive paste including conductive materials such as silver and tin. The conductive pattern 121$d$ is electrically connected to the emitter of the insulated gate bipolar transistor T1.

Each of the insulating substrates SB11 to SB13 includes a conductive pattern 121$f$ and a conductive pattern 121$e$ that are provided in the area DA4 in which the reverse blocking insulated gate bipolar transistors T3 are mounted. The conductive pattern 121$f$ is connected to the collector of the reverse blocking insulated gate bipolar transistor T3 through solder including tin or conductive paste including conductive materials such as silver and tin. The conductive pattern 121$e$ is electrically connected to the emitter of the reverse blocking insulated gate bipolar transistor T3.

The conductive patterns 121$a$, 121$b$, 121$g$, and 121$h$ of the insulating substrate SB12 are connected to the conductive patterns 121$a$, 121$b$, 121$g$, and 121$h$ of the right adjacent insulating substrate SB11 and the conductive patterns 121$a$, 121$b$, 121$g$, and 121$h$ of the left adjacent insulating substrate SB13 through wires 130 illustrated in FIG. 3, respectively.

The third auxiliary terminal ts3(T1E) and the conductive pattern 121$a$ of the insulating substrate SB13 are connected to each other through the wire 130. The third auxiliary terminal ts3(T1E) can be connected to the conductive pattern 121$a$ of the insulating substrate SB11 or the insulating substrate SB12 through the wire 130, depending on the position of the third auxiliary terminal ts3(T1E).

The second auxiliary terminal ts2(T1G) and the conductive pattern 121$b$ of the insulating substrate SB13 are connected to each other through the wire 130. The second auxiliary terminal ts2(T1G) can be connected to the conductive pattern 121$b$ of the insulating substrate SB11 or the insulating substrate SB12 through the wire 130, depending on the position of the second auxiliary terminal ts2(T1G).

The first auxiliary terminal ts1(T1P) is connected to the conductive pattern 121$c$ of the insulating substrate SB12 through the wire 130. The first auxiliary terminal ts1(T1P) can be connected to the conductive pattern 121$c$ of the insulating substrate SB11 or the insulating substrate SB13 through the wire 130, depending on the position of the first auxiliary terminal ts1(T1P).

The sixth auxiliary terminal ts6(T3E) and the conductive pattern 121$h$ of the insulating substrate SB12 are connected to each other through the wire 130. The sixth auxiliary terminal ts6(T3E) can be connected to the conductive pattern 121$h$ of the insulating substrate SB11 or the insulating substrate SB13 through the wire 130, depending on the position of the sixth auxiliary terminal ts6(T3E).

The seventh auxiliary terminal ts7(T3G) and the conductive pattern 121$g$ of the insulating substrate SB12 are connected to each other through the wire 130. The seventh auxiliary terminal ts7(T3G) can be connected to the conductive pattern 121$g$ of the insulating substrate SB11 or the insulating substrate SB13 through the wire 130, depending on the position of the seventh auxiliary terminal ts7(T3G).

A gate pad of the insulated gate bipolar transistor T1 and the conductive pattern 121$b$ are connected to each other by the wire 130. The emitter of the insulated gate bipolar transistor T1, the anode of the free wheeling diode D1, and the conductive pattern 121d are connected to each other by the wires 130.

A gate pad of the reverse blocking insulated gate bipolar transistor T3 and the conductive pattern 121g are connected to each other by the wire 130. The emitter of the reverse blocking insulated gate bipolar transistor T3 and the conductive pattern 121e are connected to each other by the wire 130.

In addition, the conductive pattern 121d and the conductive pattern 121a are connected to each other by the wire 130 and the conductive pattern 121e and the conductive pattern 121h are connected to each other by the wire 130.

A conductive pattern 122a and a conductive pattern 122b are provided at one end of each of the insulating substrates SB21 to SB23. The conductive pattern 122a is electrically connected to the fifth auxiliary terminal ts5(T2E) which outputs the emitter voltage of the insulated gate bipolar transistor T2. The conductive pattern 122b is electrically connected to the fourth auxiliary terminal ts4(T2G) which is a gate terminal for supplying the gate voltage of the insulated gate bipolar transistor T2.

A conductive pattern 122g and a conductive pattern 122f are provided at the other ends of the insulating substrates SB21 to SB23. The conductive pattern 122g is electrically connected to the eighth auxiliary terminal ts8(T4E) which outputs the emitter voltage of the reverse blocking insulated gate bipolar transistor T4. The conductive pattern 122f is electrically connected to the ninth auxiliary terminal ts9 (T4G) which is a gate terminal for supplying the gate voltage of the reverse blocking insulated gate bipolar transistor T4.

Each of the insulating substrates SB21 to SB23 includes a conductive pattern 122c and a conductive pattern 122d that are provided in the area DA2 in which the insulated gate bipolar transistors T2 are mounted. The conductive pattern 122c connects the collector of the insulated gate bipolar transistor T2 and a cathode of the free wheeling diode D2 through solder including tin or conductive paste including conductive materials such as silver and tin. The conductive pattern 122d is electrically connected to the emitter of the insulated gate bipolar transistor T2.

Here, the conductive pattern 122c is arranged over the area DA2 and the area DA3 such that the collector of the insulated gate bipolar transistor T2 is electrically connected to the emitter of the reverse blocking insulated gate bipolar transistor T4.

Each of the insulating substrates SB21 to SB23 includes the conductive pattern 122e and a portion of the conductive pattern 122c that are provided in the area DA3 in which the reverse blocking insulated gate bipolar transistors T4 are mounted. The conductive pattern 122e is connected to the collector of the reverse blocking insulated gate bipolar transistor T4 through solder including tin or conductive paste including conductive materials such as silver and tin. The portion of the conductive pattern 122c is electrically connected to the emitter of the reverse blocking insulated gate bipolar transistor T4.

The conductive patterns 122a, 122b, 122g, and 122f of the insulating substrate SB22 are connected to the conductive patterns 122a, 122b, 122g, and 122f of the right adjacent insulating substrate SB21 and the conductive patterns 122a, 122b, 122g, and 122f of the left adjacent insulating substrate SB13 by the wires 130, respectively.

The fourth auxiliary terminal ts4(T2G) and the conductive pattern 122b of the insulating substrate SB23 are connected to each other through the wire 130. The fourth auxiliary terminal ts4(T2G) can be connected to the conductive pattern 122b of the insulating substrate SB21 or the insulating substrate SB22 through the wire 130, depending on the position of the fourth auxiliary terminal ts4(T2G).

The fifth auxiliary terminal ts5(T2E) and the conductive pattern 122a of the insulating substrate SB23 are connected to each other through the wire 130. The fifth auxiliary terminal ts5(T2E) can be connected to the conductive pattern 122a of the insulating substrate SB21 or the insulating substrate SB22 through the wire 130, depending on the position of the fifth auxiliary terminal ts5(T2E).

The eighth auxiliary terminal ts8(T4E) and the conductive pattern 122g of the insulating substrate SB23 are connected to each other through the wire 130. The eighth auxiliary terminal ts8(T4E) can be connected to the conductive pattern 122g of the insulating substrate SB21 or the insulating substrate SB22 through the wire 130, depending on the position of the eighth auxiliary terminal ts8(T4E).

The ninth auxiliary terminal ts9(T4G) and the conductive pattern 122f of the insulating substrate SB23 are connected to each other through the wire 130. The ninth auxiliary terminal ts9(T4G) can be connected to the conductive pattern 122f of the insulating substrate SB21 or the insulating substrate SB22 through the wire 130, depending on the position of the ninth auxiliary terminal ts9(T4G).

A gate pad of the insulated gate bipolar transistor T2 and the conductive pattern 122b are connected to each other through the wire 130. The emitter of the insulated gate bipolar transistor T2, the anode of the free wheeling diode D2, and the conductive pattern 122d are connected to each other by the wires 130.

A gate pad of the reverse blocking insulated gate bipolar transistor T4 and the conductive pattern 122f are connected to each other by the wire 130. The emitter of the reverse blocking insulated gate bipolar transistor T4 and the conductive pattern 121g are connected to each other by the wire 130 through a portion of the conductive pattern 121c.

The conductive pattern 122d and the conductive pattern 122a are connected to each other by the wire 130.

A connection point C2 between the emitter of the reverse blocking insulated gate bipolar transistor T3 and the collector of the reverse blocking insulated gate bipolar transistor T4 in the bidirectional switching element 12 is connected to the second external connection terminal tm2(M1) which is an intermediate terminal M1 forming a main circuit terminal.

In addition, the collector of the insulated gate bipolar transistor T1 is connected to the first external connection terminal tm1(P) as a positive terminal which is connected to the positive electrode of the DC power supply.

The emitter of the insulated gate bipolar transistor T2 is connected to the fourth external connection terminal tm4(N) as a negative terminal which is connected to the negative electrode of the DC power supply.

The connection point C2 between the emitter of the reverse blocking insulated gate bipolar transistor T3 and the collector of the reverse blocking insulated gate bipolar transistor T4 in the bidirectional switching element 12 is connected to the second external connection terminal tm2 (M1) and the third external connection terminal tm3(M2) which is connected to the second external connection terminal tm2(M1) and has the same potential as the second external connection terminal tm2(M1).

The connection point C1 between the emitter of the insulated gate bipolar transistor T1 and the collector of the insulated gate bipolar transistor T2 is connected to the fifth external connection terminal tm5(U) as an AC output terminal.

In this embodiment, a circuit corresponding to one phase (for example, the U-phase) illustrated in FIG. 3 in the three-level power conversion circuit is formed by the four insulated gate bipolar transistors T1 to T4. Among the insulated gate bipolar transistors T1 to T4, the insulated gate bipolar transistors T1 and T3 are mounted on each of the insulating substrates SB11 to SB13. The insulated gate bipolar transistors T1 are connected in parallel to each other and the insulated gate bipolar transistors T3 are connected in parallel to each other. In addition, the insulated gate bipolar transistors T2 and T4 are mounted on each of the insulating substrates SB21 to SB23. The insulated gate bipolar transistors T2 are connected in parallel to each other and the insulated gate bipolar transistors T4 are connected in parallel to each other. In this way, the semiconductor device illustrated in FIG. 2 is formed.

Therefore, when the insulated gate bipolar transistors T1 and T3 mounted on the insulating substrate SB11 and the insulated gate bipolar transistors T2 and T4 mounted on the insulating substrate SB21 have a current capacity of 300 A, the total current capacity of all of the insulated gate bipolar transistors T1 to T4 in three sets of the insulating substrates SB11 and SB21, the insulating substrates SB12 and SB22, and the insulating substrates SB13 and SB23 is 900 A.

A positive conductor plate 21 is connected to each of the insulating substrates SB11 to SB13 and a negative conductor plate 22 is connected to each of the insulating substrates SB21 to SB23, as illustrated in FIG. 2. In addition, as illustrated in FIG. 2, a common intermediate potential conductor plate 23 is connected to each of the insulating substrates SB11 to SB13 and SB21 to SB23. As illustrated in FIG. 2, a common AC output conductor plate 24 is connected to each of the insulating substrates SB11 to SB13 and SB21 to SB23.

Figure 4:
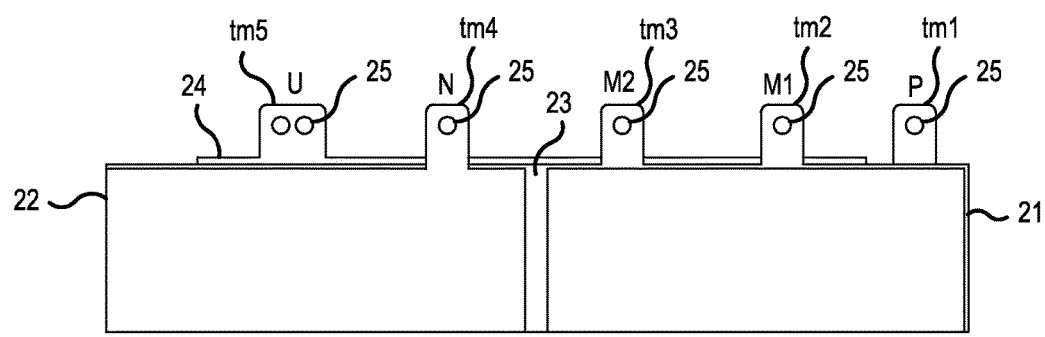
FIG. 4 is an elevation view illustrating the arrangement of a positive conductor plate, a negative conductor plate, an intermediate potential conductor plate, and an AC output conductor plate.

FIG. 4 is an elevation view illustrating the arrangement of the positive conductor plate 21, the negative conductor plate 22, the intermediate potential conductor plate 23, and the AC output conductor plate 24. As illustrated in FIG. 4, the positive conductor plate 21, the negative conductor plate 22, the intermediate potential conductor plate 23, and the AC output conductor plate 24 rise in the vertical direction with respect to the insulating substrates SB11 to SB13 and SB21 to SB23 and extend in the horizontal direction. As illustrated in FIG. 2, the positive conductor plate 21 and the negative conductor plate 22 are arranged close to one surface, that is, the front surface of the intermediate potential conductor plate 23 so as to face the intermediate potential conductor plate 23. The AC output conductor plate 24 is arranged close to the rear side of the intermediate potential conductor plate 23 so as to face the intermediate potential conductor plate 23.

The second external connection terminal tm2(M1) is formed at the right end of the intermediate potential conductor plate 23 so as to extend upward and the third external connection terminal tm3(M2) is formed at the center of the intermediate potential conductor plate 23 so as to extend upward. In addition, the first external connection terminal tm1(P) is formed on the positive conductor plate 21 on the right side of the second external connection terminal tm2 (M1) so as to extend upward. The fourth external connection terminal tm4(N) is formed on the negative conductor plate 22 on the left side of the third external connection terminal tm3(M2) so as to extend upward. The fifth external connection terminal tm5(U) is formed on the AC output conductor plate 24 on the left side of the fourth external connection terminal tm4(N) so as to extend upward.

A through hole 25 is formed in the upper part of each of the first to fifth external connection terminals tm1 to tm5.

In the case 2, concave portions (not illustrated) into which nuts are inserted are formed in the upper surface of the protrusion 5 at positions where the first to fifth external connection terminals tm1 to tm5 are arranged. Nuts (not illustrated) are inserted into the concave portions. The upper ends of the first to fifth external connection terminals tm1 to tm5 protrude upward from the upper surface of the protrusion 5 of the case 2 and are bent at the position of the upper surface of the protrusion 5 so that each through hole 25 faces a female screw portion 26 of the nut which is inserted into the concave portion of the protrusion 5.

Next, the operation of the first embodiment will be described.

FIGS. 5 to 8 are schematic diagrams illustrating the heat generating state of the semiconductor elements in each operation mode of the semiconductor device according to the first embodiment of the invention.

FIGS. 5 to 8 illustrate, as an example of the first embodiment, a modification in which each of the insulating substrates SB11 to SB13 and SB21 to SB23 is divided into two parts and one insulated gate bipolar transistor is mounted in one divided part. In this example, three insulating substrates are arranged in each of the areas DA1 to DA4.

Figure 5:
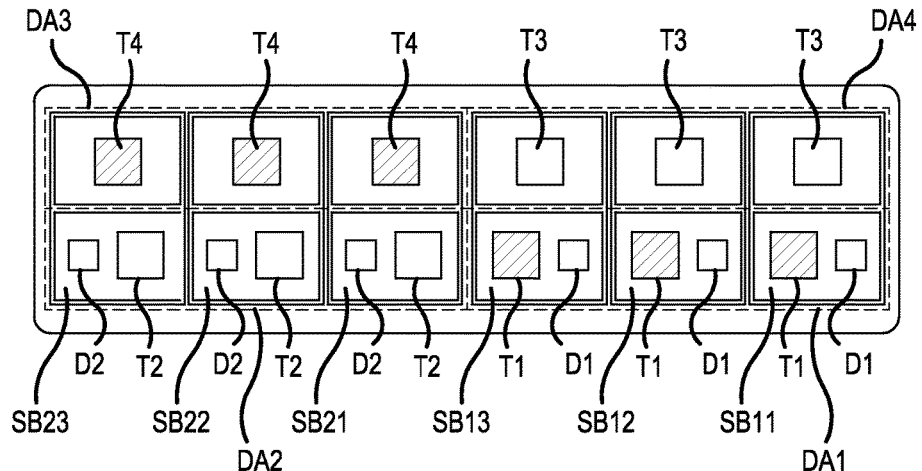
FIG. 5 is a schematic diagram illustrating the heat generating state of the semiconductor elements in an operation mode of the semiconductor device according to the first embodiment of the invention.

In an operation mode in which a gate pulse is input to the gate of the insulated gate bipolar transistor T1 to switch the gate of the insulated gate bipolar transistor T1 and the reverse blocking insulated gate bipolar transistor T4 is recovered, as illustrated in FIG. 5, heat is generated from the insulated gate bipolar transistors T1 mounted on the insulating substrates SB11 to SB13 in the area DA1 and the reverse blocking insulated gate bipolar transistors T4 mounted on the insulating substrates SB21 to SB23 in the area DA3 that is diagonally disposed with respect to the area DA1. On the other hand, no heat is generated from the areas DA2 and DA4.

Figure 6:
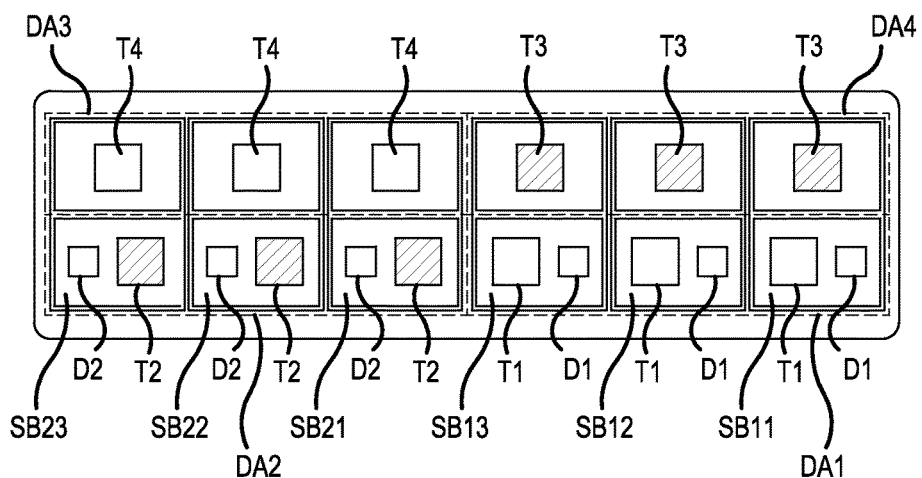
FIG. 6 is a schematic diagram illustrating the heat generating state of the semiconductor elements in another operation mode of the semiconductor device according to the first embodiment of the invention.

In an operation mode in which a gate pulse is supplied to the gate of each insulated gate bipolar transistor T2 to switch the insulated gate bipolar transistor T2 and the reverse blocking insulated gate bipolar transistor T3 is recovered, as illustrated in FIG. 6, heat is generated from the insulated gate bipolar transistors T2 mounted on the insulating substrates SB21 to SB23 in the area DA2 and the reverse blocking insulated gate bipolar transistors T3 mounted on the insulating substrates SB11 to SB13 in the area DA4 that is diagonally disposed with respect to the area DA2. On the other hand, no heat is generated from the areas DA1 and DA3.

Figure 7:
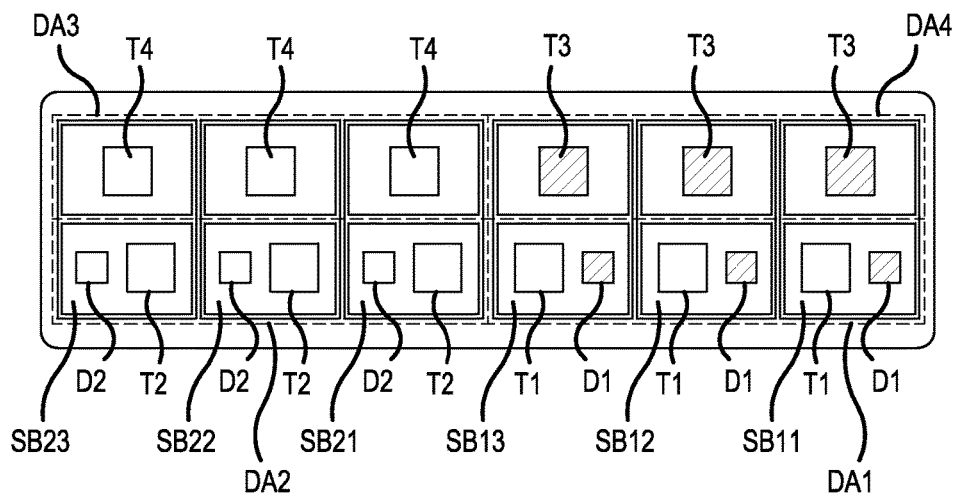
FIG. 7 is a schematic diagram illustrating the heat generating state of the semiconductor elements in still another operation mode of the semiconductor device according to the first embodiment of the invention.

In an operation mode in which a gate pulse is supplied to the gate of each reverse blocking insulated gate bipolar transistor T3 to switch the reverse blocking insulated gate bipolar transistor T3 and the insulated gate bipolar transistor T1 is recovered, as illustrated in FIG. 7, heat is generated from the free wheeling diodes D1 mounted on the insulating substrates SB11 to SB13 in the area DA1 and heat is generated from the reverse blocking insulated gate bipolar transistors T3 mounted on the insulating substrates SB11 to SB13 in the area DA4 that is adjacent to the area DA1 in the lateral direction. On the other hand, no heat is generated from the areas DA2 and DA3.

Figure 8:
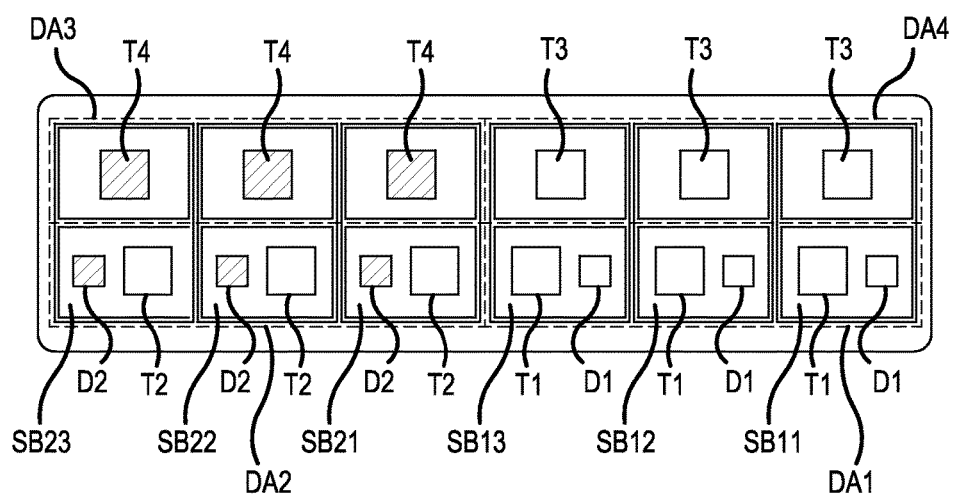
FIG. 8 is a schematic diagram illustrating the heat generating state of the semiconductor elements in yet another operation mode of the semiconductor device according to the first embodiment of the invention.

In an operation mode in which a gate pulse is supplied to the gate of each reverse blocking insulated gate bipolar transistor T4 to switch the reverse blocking insulated gate bipolar transistor T4 and the insulated gate bipolar transistor T2 is recovered, as illustrated in FIG. 8, heat is generated from the free wheeling diodes D1 mounted on the insulating substrates SB21 to SB23 in the area DA2 and heat is generated from the reverse blocking insulated gate bipolar transistors T4 mounted on the insulating substrates SB21 to SB23 in the area DA3 that is adjacent to the area DA2 in the lateral direction. On the other hand, no heat is generated from the areas DA1 and DA4.

As such, in the first embodiment, when the semiconductor device 1 is operating, not all of the areas DA1 to DA4 generate heat, but only two areas which are diagonally disposed or only two areas which are adjacent to each other in the lateral direction generate heat. That is, only two partial areas generate heat according to the operation mode.

Therefore, it is possible to disperse heat and to reliably prevent the semiconductor device 1 from being overheated, as compared to the example of the module according to the related art in which heat is generated from all of the insulating substrates on the base plate 3.

In addition, when the semiconductor device 1 according to this embodiment is used as the power conditioner (PCS) in the mega solar system using the solar cell, the semiconductor device 1 operates only as an inverter and the free wheeling diodes D1 and D2 generate a small amount of heat. Therefore, in the modes illustrated in FIGS. 7 and 8, the free wheeling diodes D1 and D2 generate a small amount of heat. As a result, it is possible to prevent the area DA4 including the insulating substrates SB11 to SB13 on which the reverse blocking insulated gate bipolar transistors T3 generating a large amount of heat are mounted and the area DA3 including the insulating substrates SB21 to SB23 on which the reverse blocking insulated gate bipolar transistors T4 generating a large amount of heat are mounted from generating heat at the same time. In addition, it is possible to prevent the occurrence of thermal interference.

Therefore, according to the first embodiment, the heat generation area is changed depending on the operation mode and the heat generation area is partial. Therefore, it is possible to effectively disperse heat.

In the first embodiment, the positive conductor plate 21 and the negative conductor plate 22 are arranged close to one surface, that is, the front surface of the intermediate potential conductor plate 23 so as to face the intermediate potential conductor plate 23. Therefore, a current flows from the first external connection terminal tm1(P) to the second external connection terminal tm2(M1) or the third external connection terminal tm3(M2) through each insulated gate bipolar transistor T1 and each reverse blocking insulated gate bipolar transistor T3. Then, the direction of a current which flows to the intermediate potential conductor plate 23 is opposite to the direction of a current which flows to the positive conductor plate 21. In this state, since the intermediate potential conductor plate 23 and the positive conductor plate 21 are arranged so as to be adjacent to each other, the magnetic field generated by the current which flows to the intermediate potential conductor plate 23 and the magnetic field generated by the current which flows to the positive conductor plate 21 cancel out each other. As a result, the influence of the magnetic field on the current which flows to the intermediate potential conductor plate 23 and the current which flows to the positive conductor plate 21 is reduced. It is possible reduce the inductance between the intermediate potential conductor plate 23 and the positive conductor plate 21 on the basis of the result.

Similarly, when a current flows from the second external connection terminal tm2(M1) or the third external connection terminal tm3(M2) to the fourth external connection terminal tm4(N) through each reverse blocking insulated gate bipolar transistor T4 and each insulated gate bipolar transistor T2, the direction of a current which flows to the intermediate potential conductor plate 23 is opposite to the direction of a current which flows to the negative conductor plate 22. It is possible to reduce the inductance between the intermediate potential conductor plate 23 and the negative conductor plate 22 which are adjacent to each other.

In addition, since the positive conductor plate 21 and the negative conductor plate 22 face the intermediate potential conductor plate 23, it is possible to increase the area of the positive conductor plate 21 and the negative conductor plate 22 which face the intermediate potential conductor plate 23 and to improve the effect of reducing inductance.

Furthermore, since the positive conductor plate 21 and the negative conductor plate 22 are linearly arranged, the positive conductor plate 21 and the negative conductor plate 22 can be electrically connected to the conductive pattern 121c on each of the insulating substrates SB11 to SB13 and the conductive pattern 122d on each of the insulating substrates SB21 to SB23 by, for example, ultrasonic bonding in a bonding portion 140 illustrated in FIG. 2.

Next, a second embodiment of the invention will be described with reference to FIGS. 9 and 10.

Figure 9:
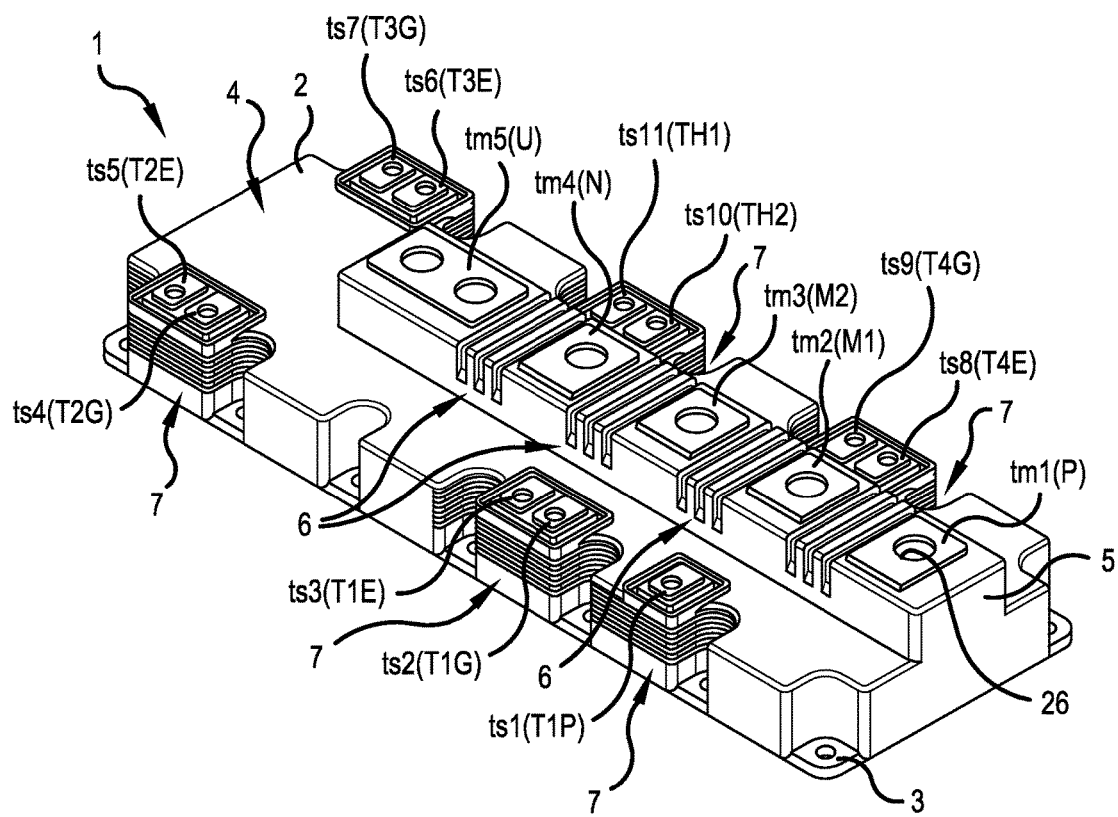
FIG. 9 is a perspective view illustrating a semiconductor device according to a second embodiment of the invention.

FIG. 9 is a perspective view illustrating a semiconductor device according to the second embodiment of the invention. FIG. 10 is a plan view illustrating semiconductor elements which are mounted on insulating substrates bonded to the base plate 3 of the semiconductor device illustrated in FIG. 9.

The semiconductor device according to the second embodiment differs from the semiconductor device according to the first embodiment in that the arrangement position of the reverse blocking insulated gate bipolar transistor T3 is interchanged with the arrangement position of the reverse blocking insulated gate bipolar transistor T4. That is, in the second embodiment, as illustrated in FIG. 10, the reverse blocking insulated gate bipolar transistor T4 which is arranged in the area DA3 of the base plate 3 in the first embodiment is mounted on each of the insulating substrates SB11 to SB13 in the area DA4. Thus, the reverse blocking insulated gate bipolar transistor T3 which is arranged in the area DA4 is mounted on each of the insulating substrates SB21 to SB23 in the area DA3. Therefore, the conductive pattern of the insulating substrate 11 is changed from the first embodiment.

A conductive pattern 123a and a conductive pattern 123b are provided at one end of each of the insulating substrates SB11 to SB13. The conductive pattern 123a is electrically connected to the third auxiliary terminal ts3(T1E) which outputs an emitter voltage of the insulated gate bipolar transistor T1. The conductive pattern 123b is electrically connected to the second auxiliary terminal ts2(T1G) which is a gate terminal for supplying a gate voltage of the insulated gate bipolar transistor T1.

A conductive pattern 123g and a conductive pattern 123f are provided at the other ends of the insulating substrates SB11 to SB13. The conductive pattern 123g is electrically connected to the eighth auxiliary terminal ts8(T4E) which outputs an emitter voltage of the reverse blocking insulated gate bipolar transistor T4. The conductive pattern 123f is electrically connected to the ninth auxiliary terminal ts9 (T4G) which is a gate terminal for supplying a gate voltage of the reverse blocking insulated gate bipolar transistor T4.

Each of the insulating substrates SB11 to SB13 includes a conductive pattern 123c and a conductive pattern 123e that are provided in the area DA1 in which the insulated gate bipolar transistors T1 are mounted. The conductive pattern 123c connects the collector of the insulated gate bipolar transistor T1 and the cathode of the free wheeling diode D1 through solder including tin or conductive paste including conductive materials such as silver and tin. The conductive pattern 123e is electrically connected to the emitter of the insulated gate bipolar transistor T1.

Here, the conductive pattern 123e is arranged over the area DA1 and the area DA4 such that the emitter of the insulated gate bipolar transistor T1 is electrically connected to the emitter of the reverse blocking insulated gate bipolar transistor T4.

Each of the insulating substrates SB11 to SB13 includes a conductive pattern 123d and a conductive pattern 123e that are provided in the area DA4 in which the reverse blocking insulated gate bipolar transistors T4 are mounted. The conductive pattern 123d is connected to the collector of the reverse blocking insulated gate bipolar transistor T4 through solder including tin or conductive paste including conductive materials such as silver and tin. The conductive pattern 123e is electrically connected to the emitter of the reverse blocking insulated gate bipolar transistor T4.

Figure 10:
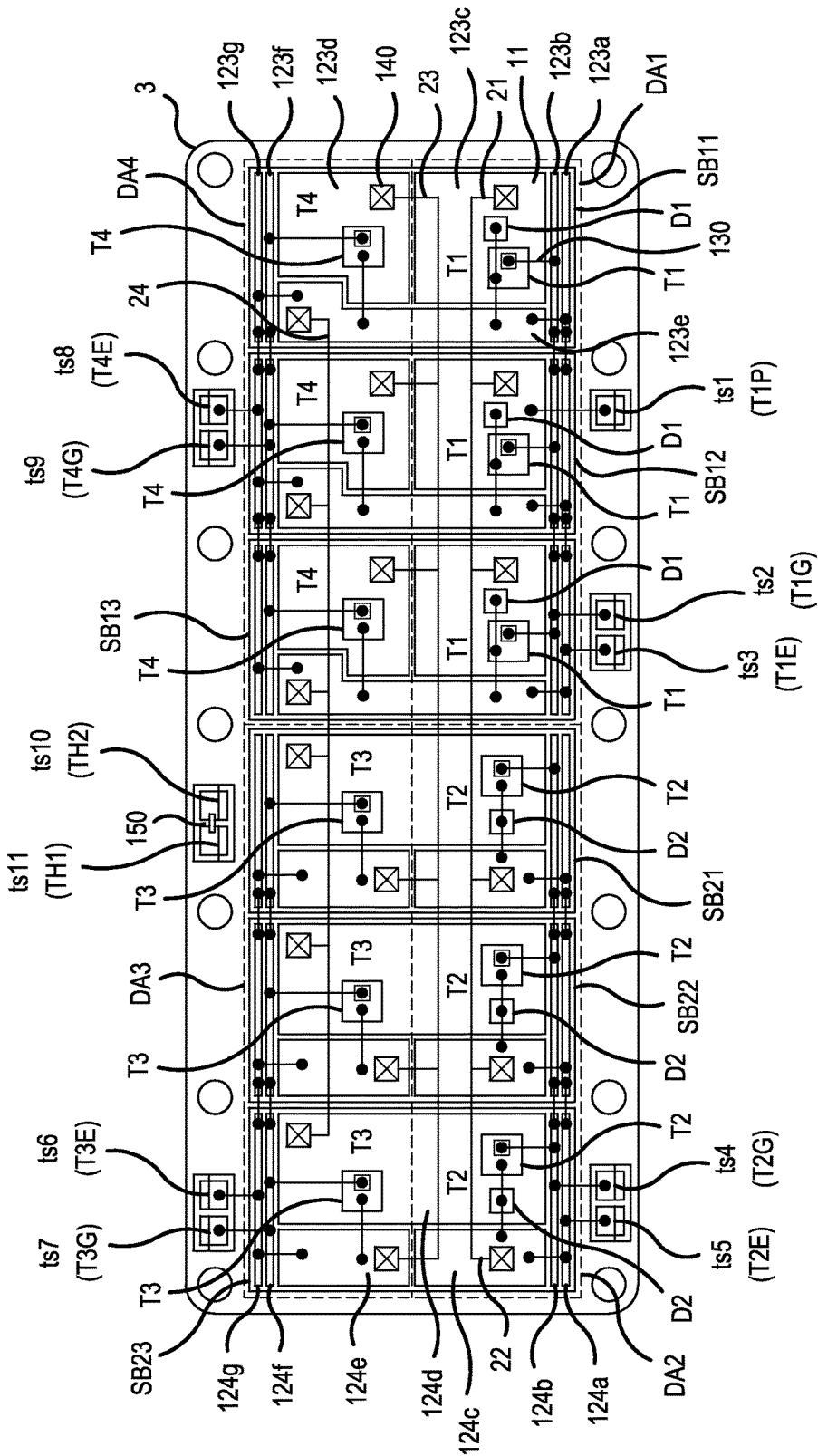
FIG. 10 is a plan view illustrating semiconductor elements mounted on insulating substrates which are bonded to a base plate of the semiconductor device illustrated in FIG. 9.

The conductive patterns 123a, 123b, 123f, and 123g of the insulating substrate SB12 are connected to the conductive patterns 123a, 123b, 123f, and 123g of the right adjacent insulating substrate SB11 and the conductive patterns 123a, 123b, 123f, and 123g of the left adjacent insulating substrate SB13 by wires 130 illustrated in FIG. 10, respectively.

The third auxiliary terminal ts3(T1E) and the conductive pattern 123a of the insulating substrate SB13 are connected to each other through the wire 130. The third auxiliary terminal ts3(T1E) can be connected to the conductive pattern 123a of the insulating substrate SB11 or the insulating substrate SB12 through the wire 130, depending on the position of the third auxiliary terminal ts3(T1E).

The second auxiliary terminal ts2(T1G) and the conductive pattern 123b of the insulating substrate SB13 are connected to each other through the wire 130. The second auxiliary terminal ts2(T1G) can be connected to the conductive pattern 123b of the insulating substrate SB11 or the insulating substrate SB12 through the wire 130, depending on the position of the second auxiliary terminal ts2(T1G).

The first auxiliary terminal ts1(T1P) and the conductive pattern 123c of the insulating substrate SB12 are connected to each other through the wire 130. The first auxiliary terminal ts1(T1P) can be connected to the conductive pattern 123c of the insulating substrate SB11 or the insulating substrate SB13 through the wire 130, depending on the position of the first auxiliary terminal ts1(T1P).

The eighth auxiliary terminal ts8(T4E) and the conductive pattern 123g of the insulating substrate SB12 are connected to each other through the wire 130. The eighth auxiliary terminal ts8(T4E) can be connected to the conductive pattern 123g of the insulating substrate SB11 or the insulating substrate SB13 through the wire 130, depending on the position of the eighth auxiliary terminal ts8(T4E).

The ninth auxiliary terminal ts9(T4G) and the conductive pattern 123f of the insulating substrate SB12 are connected to each other through the wire 130. The ninth auxiliary terminal ts9(T4G) can be connected to the conductive pattern 123f of the insulating substrate SB11 or the insulating substrate SB13 through the wire 130, depending on the position of the ninth auxiliary terminal ts9(T4G).

The gate pad of the insulated gate bipolar transistor T1 and the conductive pattern 123b are connected to each other by the wire 130. The emitter of the insulated gate bipolar transistor T1, the anode of the free wheeling diode D1, and the conductive pattern 123e are connected to each other by the wires 130.

The gate pad of the reverse blocking insulated gate bipolar transistor T4 and the conductive pattern 123f are connected to each other by the wire 130. The emitter of the reverse blocking insulated gate bipolar transistor T4 and the conductive pattern 123e are connected to each other by the wire 130.

The conductive pattern 123e is also connected to the conductive pattern 123a and the conductive pattern 123g by the wires 130.

A conductive pattern 124a and a conductive pattern 124b are provided at one end of each of the insulating substrates SB21 to SB23. The conductive pattern 124a is electrically connected to the fifth auxiliary terminal ts5(T2E) which outputs an emitter voltage of the insulated gate bipolar transistor T2. The conductive pattern 124b is electrically connected to the fourth auxiliary terminal ts4(T2G) which is a gate terminal for supplying a gate voltage of the insulated gate bipolar transistor T2.

A conductive pattern 124g and a conductive pattern 124f are provided at the other ends of the insulating substrates SB21 to SB23. The conductive pattern 124g is connected to the sixth auxiliary terminal ts6(T3E) which outputs an emitter voltage of the reverse blocking insulated gate bipolar transistor T3. The conductive pattern 124f is electrically connected to the seventh auxiliary terminal ts7(T3G) which is a gate terminal for supplying a gate voltage of the reverse blocking insulated gate bipolar transistor T3.

Each of the insulating substrates SB21 to SB23 includes a conductive pattern 124d and a conductive pattern 124c that are provided in the area DA2 in which the insulated gate bipolar transistors T2 are mounted. The conductive pattern 124d connects the collector of the insulated gate bipolar transistor T2 and the cathode of the free wheeling diode D2 through solder including tin or conductive paste including conductive materials such as silver and tin. The conductive pattern 124c is electrically connected to the emitter of the insulated gate bipolar transistor T2.

Here, the conductive pattern 124d is arranged over the area DA2 and the area DA3 such that the collector of the insulated gate bipolar transistor T2, the cathode of the free wheeling diode D2, and the collector of the reverse blocking insulated gate bipolar transistor T3 are electrically connected to each other.

Each of the insulating substrates SB21 to SB23 includes the conductive pattern 124d and a conductive pattern 124e that are provided in the area DA3 in which the reverse blocking insulated gate bipolar transistors T3 are mounted. The conductive pattern 124d connects the collector of the reverse blocking insulated gate bipolar transistor T3 through solder including tin or conductive paste including conductive materials such as silver and tin. The conductive pattern 124e is electrically connected to the emitter of the reverse blocking insulated gate bipolar transistor T3.

The conductive patterns 124a, 124b, 124f, and 124g of the insulating substrate SB22 are connected to the conductive patterns 124a, 124b, 124f, and 124g of the right adjacent insulating substrate SB21 and the conductive patterns 124a, 124b, 124f, and 124g of the left adjacent insulating substrate SB23 by the wires 30 illustrated in FIG. 10, respectively.

The fourth auxiliary terminal ts4(T2G) and the conductive pattern 124b of the insulating substrate SB23 are connected to each other through the wire 130. The fourth auxiliary terminal ts4(T2G) can be connected to the conductive pattern 124b of the insulating substrate SB21 or the insulating substrate SB22 through the wire 130, depending on the position of the fourth auxiliary terminal ts4(T2G).

The fifth auxiliary terminal ts5(T2E) and the conductive pattern 124a of the insulating substrate SB23 are connected to each other through the wire 130. The fifth auxiliary terminal ts5(T2E) can be connected to the conductive pattern 124a of the insulating substrate SB21 or the insulating substrate SB22 through the wire 130, depending on the position of the fifth auxiliary terminal ts5(T2E).

The sixth auxiliary terminal ts6(T3E) and the conductive pattern 124g of the insulating substrate SB23 are connected to each other through the wire 130. The sixth auxiliary terminal ts6(T3E) can be connected to the conductive pattern 124g of the insulating substrate SB21 or the insulating substrate SB22 through the wire 130, depending on the position of the sixth auxiliary terminal ts6(T3E).

The seventh auxiliary terminal ts7(T3G) and the conductive pattern 124f of the insulating substrate SB23 are connected to each other through the wire 130. The seventh auxiliary terminal ts7(T3G) can be connected to the conductive pattern 124f of the insulating substrate SB21 or the insulating substrate SB22 through the wire 130, depending on the position of the seventh auxiliary terminal ts7(T3G).

The gate pad of the insulated gate bipolar transistor T2 and the conductive pattern 124b are connected to each other by the wire 130. The emitter of the insulated gate bipolar transistor T2, the anode of the free wheeling diode D2, and the conductive pattern 124c are connected to each other by the wires 130.

The gate pad of the reverse blocking insulated gate bipolar transistor T3 and the conductive pattern 124f are connected to each other by the wires 130. The emitter of the reverse blocking insulated gate bipolar transistor T3 and the conductive pattern 124e are connected to each other by the wires 130.

In addition, the conductive pattern 124a and the conductive pattern 124c are connected to each other by the wires 130 and the conductive pattern 124e and the conductive pattern 124g are connected to each other by the wires 130.

Therefore, as illustrated in FIG. 9, the second embodiment differs from the first embodiment illustrated in FIG. 1 in that, on the terminal arrangement surface 4 of the case 2, the arrangement position of the sixth auxiliary terminal ts6(T3E) is interchanged with the arrangement position of the eighth auxiliary terminal ts8(T4E) in the longitudinal direction of the case 2. In addition, the arrangement position of the seventh auxiliary terminal ts7(T3G) is interchanged with the arrangement position of the ninth auxiliary terminal ts9(T4G) in the longitudinal direction of the case 2, as compared to the structure illustrated in FIG. 1.

The other structures are the same as those in the first embodiment. Therefore, portions corresponding to those illustrated in FIGS. 1 and 2 are denoted by the same reference numerals and the detailed description thereof will not be repeated.

The second embodiment differs from the first embodiment in that the arrangement of the reverse blocking insulated gate bipolar transistor T3 is interchanged with the arrangement of the reverse blocking insulated gate bipolar transistor T4 in the longitudinal direction. Therefore, of course, the areas from which heat is generated in the first embodiment are interchanged with each other in the longitudinal direction, which is not illustrated.

FIGS. 11A-11D are diagrams schematically illustrating the heat generating state of a semiconductor element in each operation mode of the semiconductor device according to the second embodiment. In FIGS. 11A-11D, the insulating substrates SB11 to SB23 in the areas DA1 to DA4 are represented by grids and the insulated gate bipolar transistors T1 and T2 and the reverse blocking insulated gate bipolar transistors T3 and T4 which are mounted on the insulating substrates SB11 to SB23 are represented by reference numerals in the grids. The heat generating state of the transistors is represented by hatching.

In a mode in which the insulated gate bipolar transistor T1 is in a switching state and the reverse blocking insulated gate bipolar transistor T4 is recovered, as illustrated in FIG. 11A, heat is generated from the areas DA1 and DA4. In this case, the amount of heat generated from the area DA1 is more than the amount of heat generated from the area DA4.

In a mode in which the insulated gate bipolar transistor T2 is in a switching state and the reverse blocking insulated gate bipolar transistor T3 is recovered, as illustrated in FIG. 11B, heat is generated from the areas DA2 and DA3. In this case, the amount of heat generated from the area DA2 is more than the amount of heat generated from the area DA3.

In a mode in which the reverse blocking insulated gate bipolar transistor T3 is in a switching state and the insulated gate bipolar transistor T1 is recovered, as illustrated in FIG. 11C, heat is generated from the area DA1 and the area DA3 which is diagonally arranged with respect to the DA1. In this case, the amount of heat generated from the area DA3 is more than the amount of heat generated from the area DA1 since only the free wheeling diode D1 generates heat in the area DA1.

In a mode in which the reverse blocking insulated gate bipolar transistor T4 is in a switching state and the insulated gate bipolar transistor T2 is recovered, as illustrated in FIG. 11D, heat is generated from the area DA2 and the area DA4 which is diagonally arranged with respect to the DA2. In this case, the amount of heat generated from the area DA4 is more than the amount of heat generated from the area DA2 since only the free wheeling diode D2 generates heat in the area DA2.

The arrangement positions of the positive conductor plate 21, the negative conductor plate 22, the intermediate potential conductor plate 23, and the AC output conductor plate 24 are not changed, as illustrated in FIG. 10. Therefore, similarly to the first embodiment, the direction of a current which flows to the intermediate potential conductor plate 23 is opposite to the direction of a current which flows to the positive conductor plate 21 arranged close to the intermediate potential conductor plate 23. In addition, the direction of the current which flows to the intermediate potential conductor plate 23 is opposite to the direction of a current which flows to the negative conductor plate 22 arranged close to the intermediate potential conductor plate 23. Therefore, it is possible to reduce the inductance between the intermediate potential conductor plate 23 and the positive conductor plate 21 and the inductance between the intermediate potential conductor plate 23 and the negative conductor plate 22.

Accordingly, also in the second embodiment, it is possible to reduce inductance in the semiconductor device 1. In addition, heat is not simultaneously generated from the entire base plate 3 in the semiconductor device 1, but the heat generation area is changed depending on the operation mode. Therefore, it is possible to reliably disperse heat and to reliably prevent the semiconductor device 1 from being overheated.

Figure 12A:
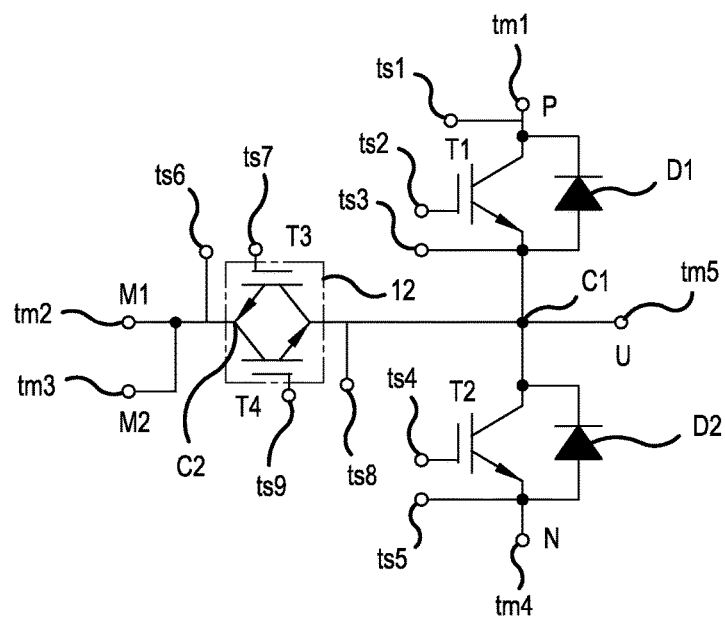
FIG. 12A is a diagram illustrating the structure of an example of a three-level power conversion circuit according to the second embodiment.
Figure 12B:
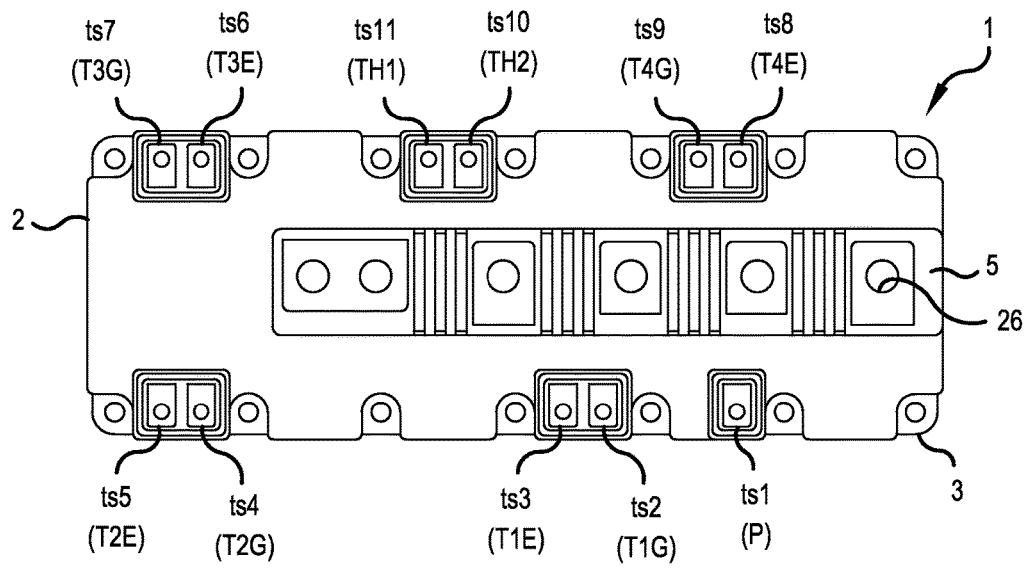
FIG. 12B is a diagram illustrating the arrangement of terminals.
Figure 13A:
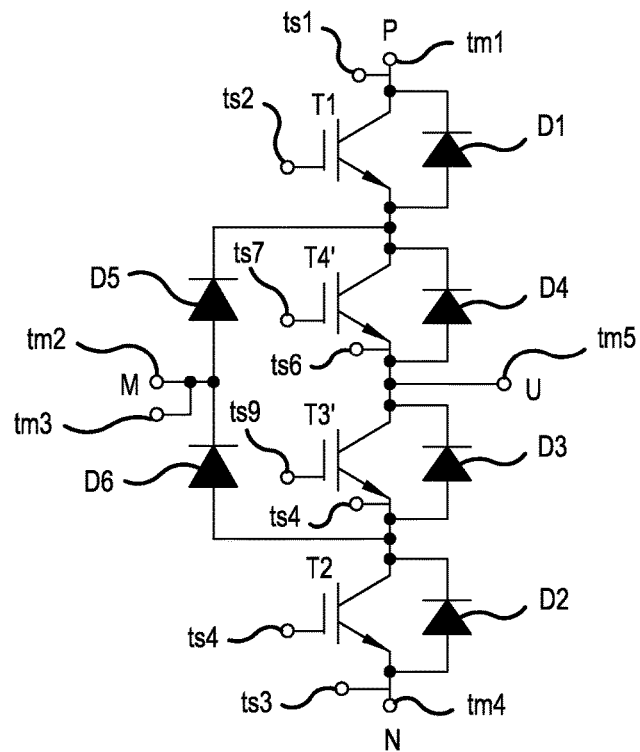
FIG. 13A is a diagram illustrating the structure of another example of the three-level power conversion circuit according to the second embodiment.

FIG. 12A illustrates the structure of an example of a three-level power conversion circuit according to the second embodiment and FIG. 12B illustrates the arrangement of the terminals. FIG. 13A illustrates the structure of another example of the three-level power conversion circuit according to the second embodiment and FIG. 13B illustrates the arrangement of the terminals.

As described above, the arrangement of the terminals of the case 2 in an example of the three-level power conversion circuit according to the second embodiment is a change in the arrangement of the terminals in the first embodiment, as illustrated in FIG. 12B. However, the circuit structure illustrated in FIG. 12A is the same as the circuit structure in the first embodiment illustrated in FIG. 3.

Figure 13B:
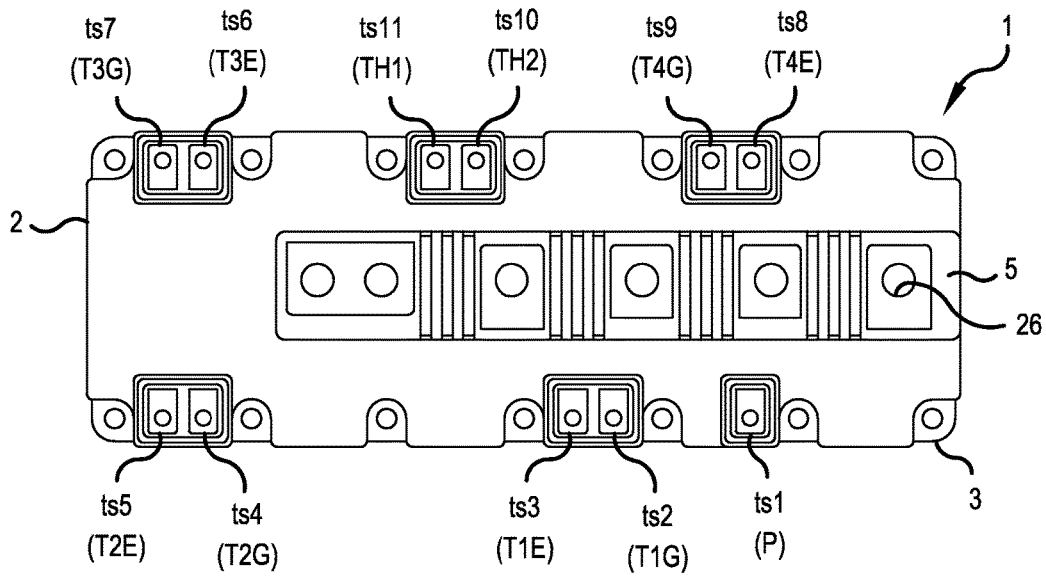
FIG. 13B is a diagram illustrating the arrangement of terminals.

In the second embodiment, even when the structure of the three-level power conversion circuit is changed from the circuit structure using the reverse blocking insulated gate bipolar transistors T3 and T4 illustrated in FIG. 12A to another example of the circuit structure illustrated in FIG. 13A in which the internal wiring patterns are interchanged and which uses insulated gate bipolar transistors T3' and T4', the arrangement of the terminals of the case 2 illustrated in FIG. 13B is the same as the arrangement of the terminals illustrated in FIG. 12B and it is possible to obtain the same AC output voltage in the same operation mode.

That is, instead of the reverse blocking insulated gate bipolar transistors T3 and T4 illustrated in FIG. 12A, the insulated gate bipolar transistors T3' and T4' which are respectively connected in inverse parallel to free wheeling diodes D3 and D4 corresponding to the reverse blocking insulated gate bipolar transistors T3 and T4 are applied to the three-level power conversion circuit illustrated in FIG. 13A.

A collector of the insulated gate bipolar transistor T4' which is connected in inverse parallel to the free wheeling diode D4 is connected to the emitter of the insulated gate bipolar transistor T1 which is connected in inverse parallel to the free wheeling diode D1, similarly to those used in the circuit illustrated in FIG. 12A. In addition, an emitter of the insulated gate bipolar transistor T4' is connected to a collector of the insulated gate bipolar transistor T3' which is connected in inverse parallel to the free wheeling diode D3. The fifth external connection terminal tm5(U) is connected to a connection point between the emitter of the insulated gate bipolar transistor T4' and the collector of the insulated gate bipolar transistor T3'.

An emitter of the insulated gate bipolar transistor T3' is connected to the collector of the insulated gate bipolar transistor T2 which is connected in inverse parallel to the free wheeling diode D2.

In addition, a cathode of a diode D5 is connected to a connection point between the emitter of the insulated gate bipolar transistor T1 and the collector of the insulated gate bipolar transistor T4'. An anode of the diode D5 is connected to a cathode of a diode D6 and an anode of the diode D6 is connected to a connection point between the emitter of the insulated gate bipolar transistor T3' and the collector of the insulated gate bipolar transistor T2. The second and third external connection terminals tm2(M1) and tm3(M2) are connected to a connection point between the anode of the diode D5 and the cathode of the diode D6.

Figure 14A:
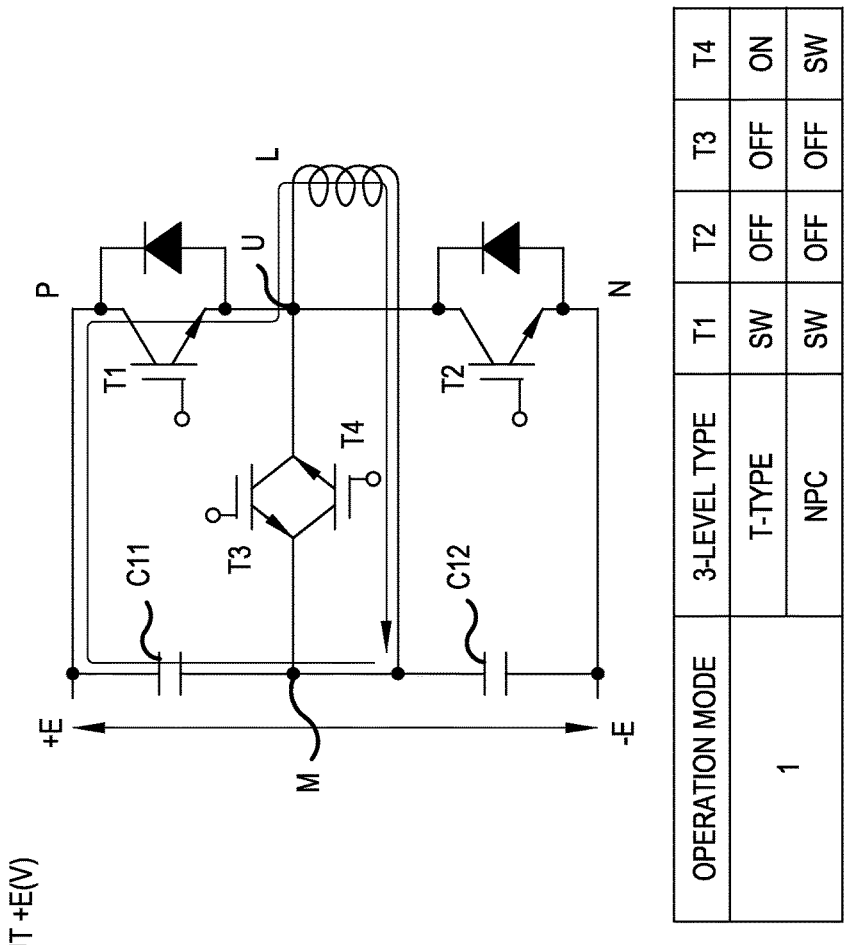
FIGS. 14A and 14B are diagrams illustrating comparison between a current path in the circuit structure illustrated in FIG. 12A and a current path in the circuit structure illustrated in FIG. 13A when a positive voltage is output in the second embodiment.
Figure 14B:
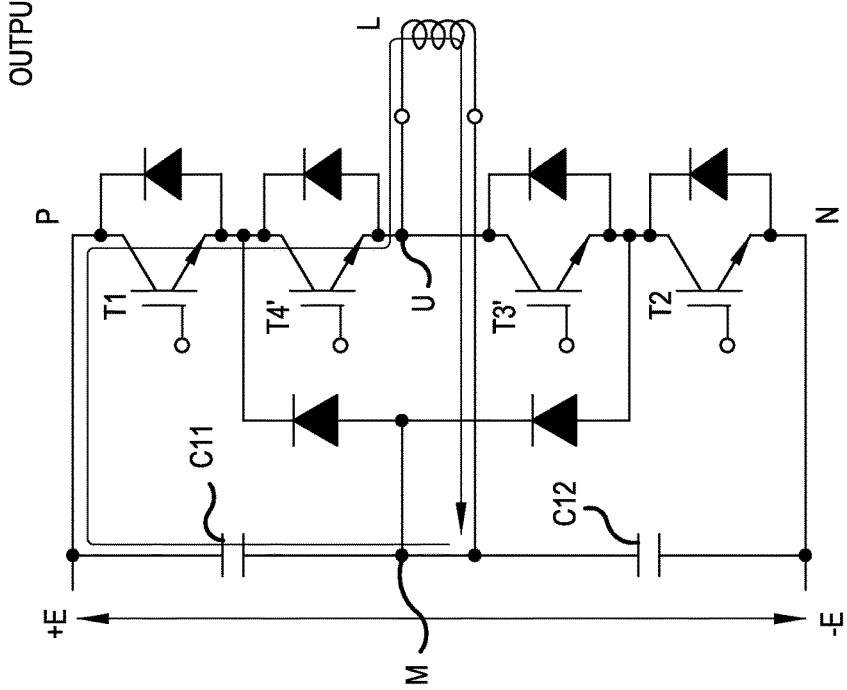

FIGS. 14A and 14B are diagrams illustrating the comparison between a current path in the circuit structure illustrated in FIG. 12A and a current path in the circuit structure illustrated in FIG. 13A when a positive voltage is output in the second embodiment.

In this case, in the three-level voltage conversion circuits with different circuit structures as illustrated in FIGS. 12A and 13A, as illustrated in FIGS. 14A and 14B, in order to achieve a first operation mode in which the voltage output from the fifth external connection terminal tm5(U) is a DC voltage +E(V) for charging a capacitor C11, the insulated gate bipolar transistor T1 is switched to turn on the reverse blocking insulated gate bipolar transistor T4 and to turn off the insulated gate bipolar transistor T2 and the reverse blocking insulated gate bipolar transistor T3, in the circuit with the structure illustrated in FIG. 12A. Meanwhile, in the circuit with the structure illustrated in FIG. 13A, the insulated gate bipolar transistor T1 is switched to turn on the insulated gate bipolar transistor T4' and to turn off the insulated gate bipolar transistors T2 and T3'.

In this case, the path of a current which flows to the three-level voltage conversion circuit with the structure illustrated in FIG. 12A is from a positive electrode of the capacitor C11 to a negative electrode of the capacitor C11 through the insulated gate bipolar transistor T1 and an inductive load L, as illustrated in FIG. 14(a). Therefore, an output voltage +E(V) is applied to the inductive load L.

In contrast, the path of a current which flows to the three-level voltage conversion circuit with the structure illustrated in FIG. 13A is from the positive electrode of the capacitor C11 to the negative electrode of the capacitor C11 through the insulated gate bipolar transistors T1 and T4' and the inductive load L, as illustrated in FIG. 14B. Therefore, the output voltage +E(V) is applied to the inductive load L.

When the same type of gate signal is applied to the four insulated gate bipolar transistors T1 to T4 of the circuit with the structure illustrated in FIG. 12A and the four insulated gate bipolar transistors T1 to T4' of the circuit with the structure illustrated in FIG. 13A, the same output voltage is output.

FIGS. 15A and 15B are diagrams illustrating the comparison between a current path in the circuit structure illustrated in FIG. 12A and a current path in the circuit structure illustrated in FIG. 13A when a negative voltage is output in the second embodiment.

On the contrary to the above, in order to achieve a second operation mode in which the voltage output from the fifth external connection terminal tm5(U) is a DC voltage −E(V) for charging a capacitor C12, as illustrated in FIGS. 15A and 15B, the insulated gate bipolar transistor T2 is switched to input a gate signal for turning on the reverse blocking insulated gate bipolar transistor T3, in the circuit with the structure illustrated in FIG. 12A. Gate signals for turning off the remaining insulated gate bipolar transistor T1 and reverse blocking insulated gate bipolar transistor T4 are input to the remaining insulated gate bipolar transistor T1 and the reverse blocking insulated gate bipolar transistor T4.

In this case, the path of the current which flows to the three-level voltage conversion circuit with the structure illustrated in FIG. 12A is from a positive electrode of the capacitor C12 to a negative electrode of the capacitor C12 through the inductive load L and the insulated gate bipolar transistor T2, as illustrated in FIG. 15A. Therefore, an output voltage −E(V) can be applied to the inductive load L.

In contrast, the path of the current which flows to the three-level voltage conversion circuit with the structure illustrated in FIG. 13A is from the positive electrode of the capacitor C12 to the negative electrode of the capacitor C12 through the inductive load L, the insulated gate bipolar transistor T3', and the second insulated gate bipolar transistor T2, as illustrated in FIG. 15B. Therefore, the output voltage −E(V) can be applied to the inductive load L.

In this case, the same gate signal is applied to the four insulated gate bipolar transistors T1 to T4 of the circuit with the structure illustrated in FIG. 12A and the four insulated gate bipolar transistors T1 to T4' of the circuit with the structure illustrated in FIG. 13A and the same output voltage is output in the structure illustrated in FIG. 12A and the structure illustrated in FIG. 13A.

Figure 16A:
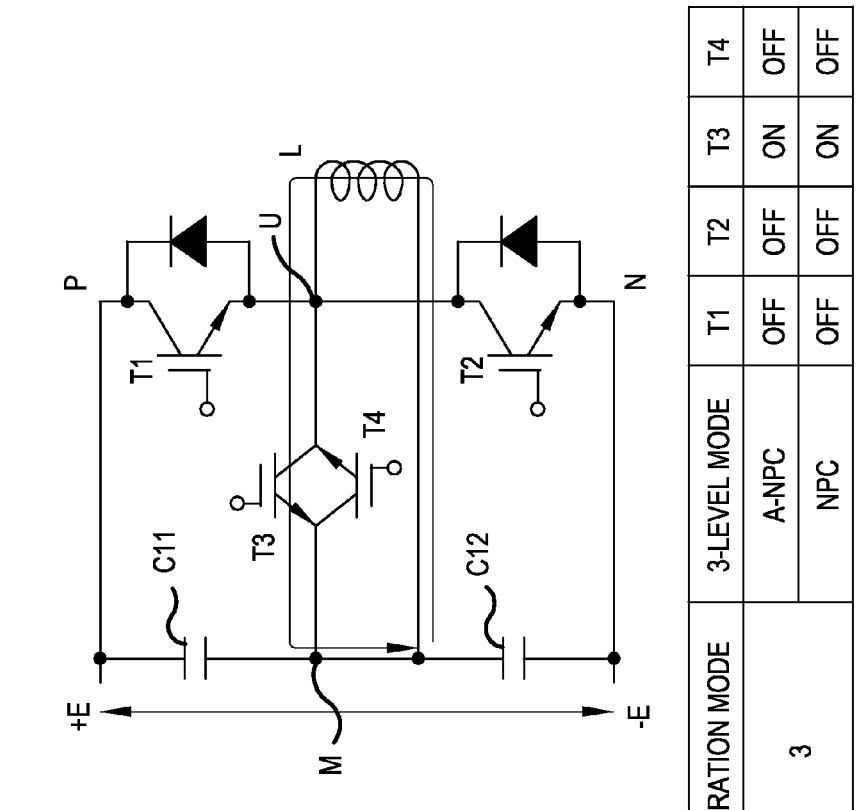
FIGS. 16A and 16B are diagrams illustrating comparison between a current path in the circuit structure illustrated in FIG. 12A and a current path in the circuit structure illustrated in FIG. 13A when a voltage of 0 V is output in the second embodiment.
Figure 16B:
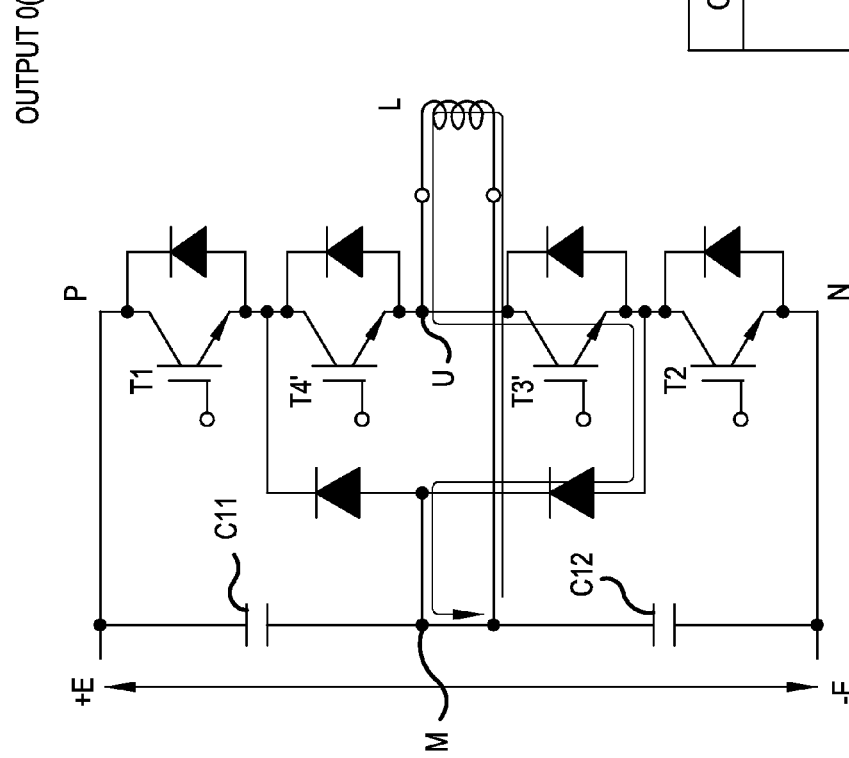

In addition, in a third operation mode in which the output voltage of the fifth external connection terminal tm5(U) is 0 (V), as illustrated in FIGS. 16A and 16B, a gate signal for turning on the reverse blocking insulated gate bipolar transistor T3 is input and a gate signal for turning off transistors is input to the other insulated gate bipolar transistors T1 and T2 and reverse blocking insulated gate bipolar transistor T4.

In this case, as illustrated in FIG. 16A, the current which flows to the three-level voltage conversion circuit with the structure illustrated in FIG. 12A flows from a connection point between the capacitors C11 and C12, passes through the inductive load L and the reverse blocking insulated gate bipolar transistor T3, and returns to the connection point between the capacitors C11 and C12. Therefore, the output voltage applied to the inductive load L is 0 (V).

In contrast, as illustrated in FIG. 16B, the current which flows to the three-level voltage conversion circuit with the structure illustrated in FIG. 13A flows from the connection point between the capacitors C11 and C12, passes through the inductive load L, the insulated gate bipolar transistor T3', and the diode D6, and returns to the connection point between the capacitors C11 and C12. Therefore, the output voltage applied to the inductive load L is 0 (V).

Therefore, in this operation mode, the same type of gate signal is applied to the four insulated gate bipolar transistors T1 to T4 of the circuit with the structure illustrated in FIG. 12A and the four insulated gate bipolar transistors T1 to T4' of the circuit with the structure illustrated in FIG. 13A and the same output voltage is output in the structure illustrated in FIG. 12A and the structure illustrated in FIG. 13A.

As such, even when the structure of the three-level power conversion circuit provided in the semiconductor device 1 is different, the first to fifth external connection terminals tm1 to tm5 and the first to eleventh auxiliary terminals ts1 to ts11 are arranged at the same positions in the circuit structure and the same output voltage is obtained with respect to the same type of gate signal in each operation mode. Therefore, the user can use the semiconductor device 1 without being aware of the structure of the three-level power conversion circuit provided in the semiconductor device 1 and it is possible to provide a semiconductor device with high compatibility.

Next, a third embodiment of the invention will be described with reference to FIGS. 17 and 18A-18D.

Figure 17:
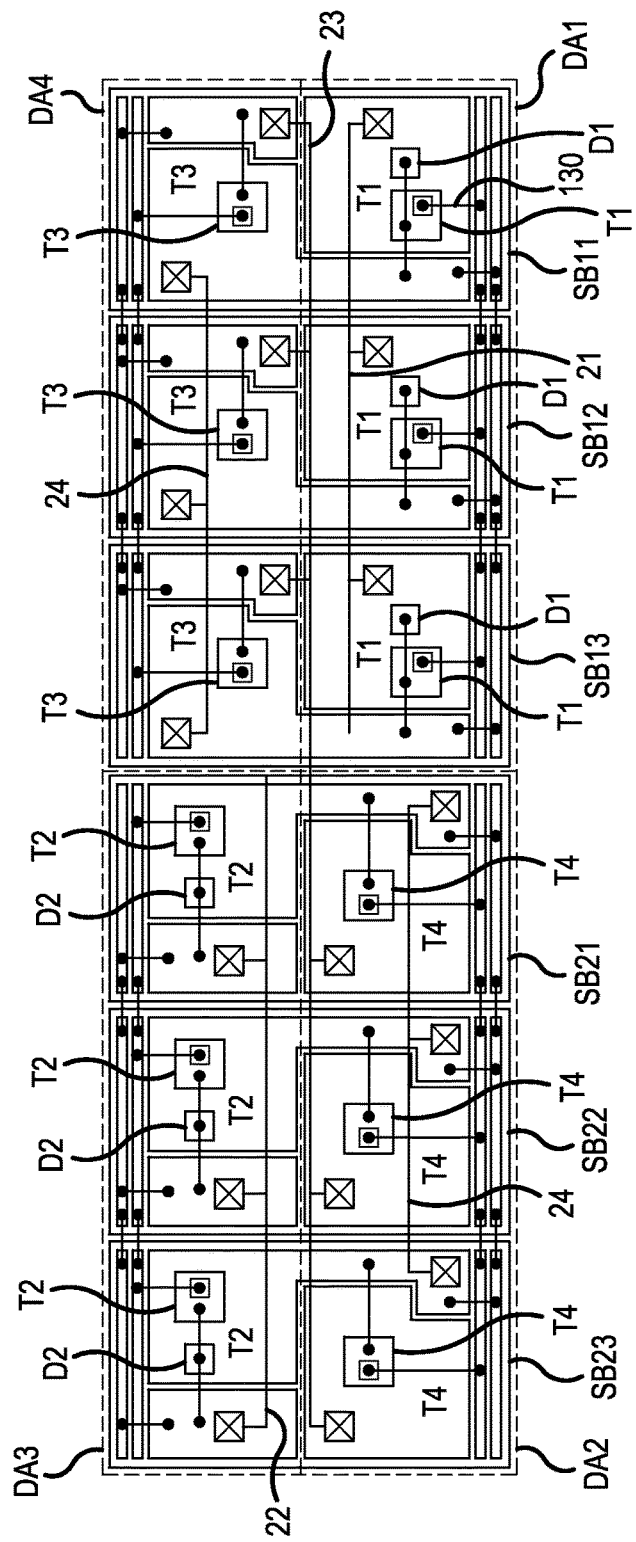
FIG. 17 is a plan view illustrating insulating substrates having semiconductor elements mounted thereon in a semiconductor device according to a third embodiment of the invention.

FIG. 17 is a plan view illustrating insulating substrates having semiconductor elements mounted thereon in a semiconductor device according to the third embodiment of the invention. The base plate 3 and the first to eleventh auxiliary terminals ts1 to ts11 illustrated in FIG. 2 are not illustrated in FIG. 17. In the third embodiment, the insulated gate bipolar transistors T1 and T2 which generate the largest amount of heat in the first embodiment are diagonally arranged.

That is, in the third embodiment, as illustrated in FIG. 17, in the structure according to the first embodiment illustrated in FIG. 2, the insulated gate bipolar transistor T2 which is arranged in the area DA2 is arranged in the area DA3 of each of the insulating substrates SB21 to SB23 and the reverse blocking insulated gate bipolar transistor T4 which is arranged in the area DA3 is arranged in the area DA2 of each of the insulating substrates SB21 to SB23.

With the change in arrangement, the arrangement relation of the negative conductor plate 22 and the AC output conductor plate 24 relative to the intermediate potential conductor plate 23 is changed.

That is, the arrangement of the intermediate potential conductor plate 23 and the positive conductor plate 21 is the same as that in the first embodiment. The negative conductor plate 22 is arranged close to the rear surface of the intermediate potential conductor plate 23 in the area DA3 so as to face the intermediate potential conductor plate 23. In addition, the AC output conductor plate 24 is divided and arranged in the areas DA2 and DA4.

The other structures are the same as those in the first embodiment. Therefore, portions corresponding to those illustrated in FIG. 2 are denoted by the same reference numerals and the detailed description thereof will not be repeated.

According to the third embodiment, the positive conductor plate 21 is arranged close to the front surface of the intermediate potential conductor plate 23 so as to face the intermediate potential conductor plate 23 and the negative conductor plate 22 is arranged close to the rear surface of the intermediate potential conductor plate 23 so as to face the intermediate potential conductor plate 23. The direction of a current which flows to the intermediate potential conductor plate 23 is opposite to the direction of a current which flows to the positive conductor plate 21 and the direction of the current which flows to the intermediate potential conductor plate 23 is opposite to the direction of a current which flows to the negative conductor plate 22. Therefore, as described above, it is possible to reduce the inductance between the intermediate potential conductor plate 23 and the positive conductor plate 21 and the inductance between the intermediate potential conductor plate 23 and the negative conductor plate 22.

In addition, the insulated gate bipolar transistor T2 and the reverse blocking insulated gate bipolar transistor T4 are interchanged with each other and the conductive patterns are also interchanged.

Regarding the generation of heat, in the third embodiment, since the areas DA2 and DA3 are interchanged with each other, as compared to the first embodiment, heat is generated in each operation mode, as schematically illustrated in FIGS. 18A-18D.

That is, in an operation mode in which the a gate pulse is input to the gate of the insulated gate bipolar transistor T1 to perform switching and the reverse blocking insulated gate bipolar transistor T4 is recovered, as illustrated in FIG. 18A, heat is generated from the insulated gate bipolar transistors T1 mounted on the insulating substrates SB11 to SB13 in the area DA1 and the reverse blocking insulated gate bipolar transistors T4 mounted on the insulating substrates SB21 to SB23 in the area DA2 which is adjacent to the left side of the area DA1. On the other hand, no heat is generated from the areas DA3 and DA4.

In an operation mode in which the a gate pulse is supplied to the gate of the insulated gate bipolar transistor T2 to perform switching and the reverse blocking insulated gate bipolar transistor T3 is recovered, as illustrated in FIG. 18B, heat is generated from the insulated gate bipolar transistors T2 mounted on the insulating substrates SB21 to SB23 in the area DA3 and the reverse blocking insulated gate bipolar transistors T3 mounted on the insulating substrates SB11 to SB13 in the area DA4 which is adjacent to the right side of the area DA3. On the other hand, no heat is generated from the areas DA1 and DA2.

In an operation mode in which a gate pulse is supplied to the gate of the reverse blocking insulated gate bipolar transistor T3 to switch the reverse blocking insulated gate bipolar transistor T3 and the insulated gate bipolar transistor T1 is recovered, as illustrated in FIG. 18C, heat is generated from the free wheeling diodes D1 mounted on the insulating substrates SB11 to SB13 in the area DA1 and heat is generated from the reverse blocking insulated gate bipolar transistors T3 mounted on the insulating substrates SB11 to SB13 in the area DA4 which is disposed on the rear side of the area DA1. On the other hand, no heat is generated from the areas DA2 and DA3.

In an operation mode in which a gate pulse is supplied to the gate of the reverse blocking insulated gate bipolar transistor T4 to switch the reverse blocking insulated gate bipolar transistor T4 and the insulated gate bipolar transistor T2 is recovered, as illustrated in FIG. 18D, heat is generated from the reverse blocking insulated gate bipolar transistors T4 mounted on the insulating substrates SB21 to SB23 in the area DA2 and heat is generated from the free wheeling diode D1 in the area DA3 which is disposed on the rear side of the area DA2. On the other hand, no heat is generated from the areas DA1 and DA4.

As such, according to the third embodiment, when the semiconductor device 1 is operating, not all of the areas DA1 to DA4 generate heat simultaneously, but only two areas which are adjacent in the left-right direction or only two areas which are adjacent in the front-rear direction generate heat, similarly to the first embodiment. That is, only two partial areas generate heat according to the operation mode.

Therefore, it is possible to disperse heat and to reliably prevent the semiconductor device 1 from being overheated, as compared to the example of the module according to the related art in which heat is generated from all of the insulating substrates on the base plate 3.

Figure 19:
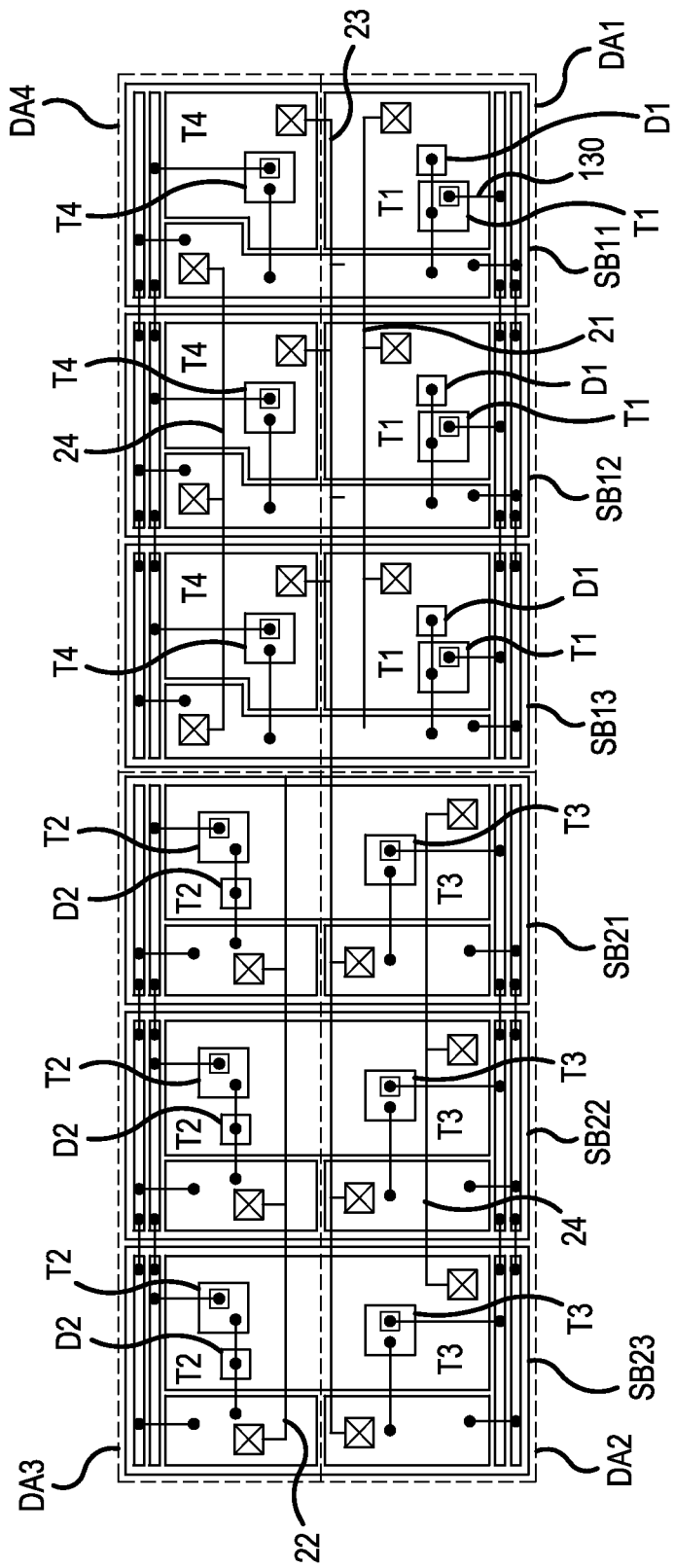
FIG. 19 is a plan view illustrating insulating substrates having semiconductor elements mounted thereon in a modification of the semiconductor device according to the third embodiment of the invention.

In the third embodiment, the insulated gate bipolar transistor T2 and the reverse blocking insulated gate bipolar transistor T4 which are respectively arranged in the areas DA2 and DA3 in the first embodiment are interchanged so as to be arranged in the areas DA3 and DA2, respectively. However, the invention is not limited to the above-mentioned structure. As illustrated in FIGS. 19 and 20, in the third embodiment, the area DA2 and the area DA4 may be interchanged with each other such that the reverse blocking insulated gate bipolar transistor T4 and the reverse blocking insulated gate bipolar transistor T3 may be arranged in the area DA4 and the area DA2, respectively.

FIG. 19 is a plan view illustrating insulating substrates having semiconductor elements mounted thereon in a modification of the semiconductor device according to the third embodiment of the invention. FIGS. 20A-20D are diagrams schematically the heat generating state of semiconductor elements in each operation mode in the modification of the semiconductor device according to the third embodiment of the invention. In the modification, although not described here, the arrangement relation among the positive conductor plate 21, the negative conductor plate 22, the intermediate potential conductor plate 23, and the AC output conductor plate 24 is the same as that in the third embodiment. Therefore, it is possible to obtain the effect of reducing inductance. In addition, in the modes illustrated in FIGS. 18A-18D, heat is generated as illustrated in FIGS. 20A-20D. Therefore, similarly to the third embodiment, heat is generated from two areas which are adjacent in the front-rear direction and two areas which are adjacent in the left-right direction and it is possible to obtain the same operation and effect as those in the first to third embodiments.

Next, a fourth embodiment of the invention will be described with reference to FIGS. 21 and 22A-22D.

Figure 21:
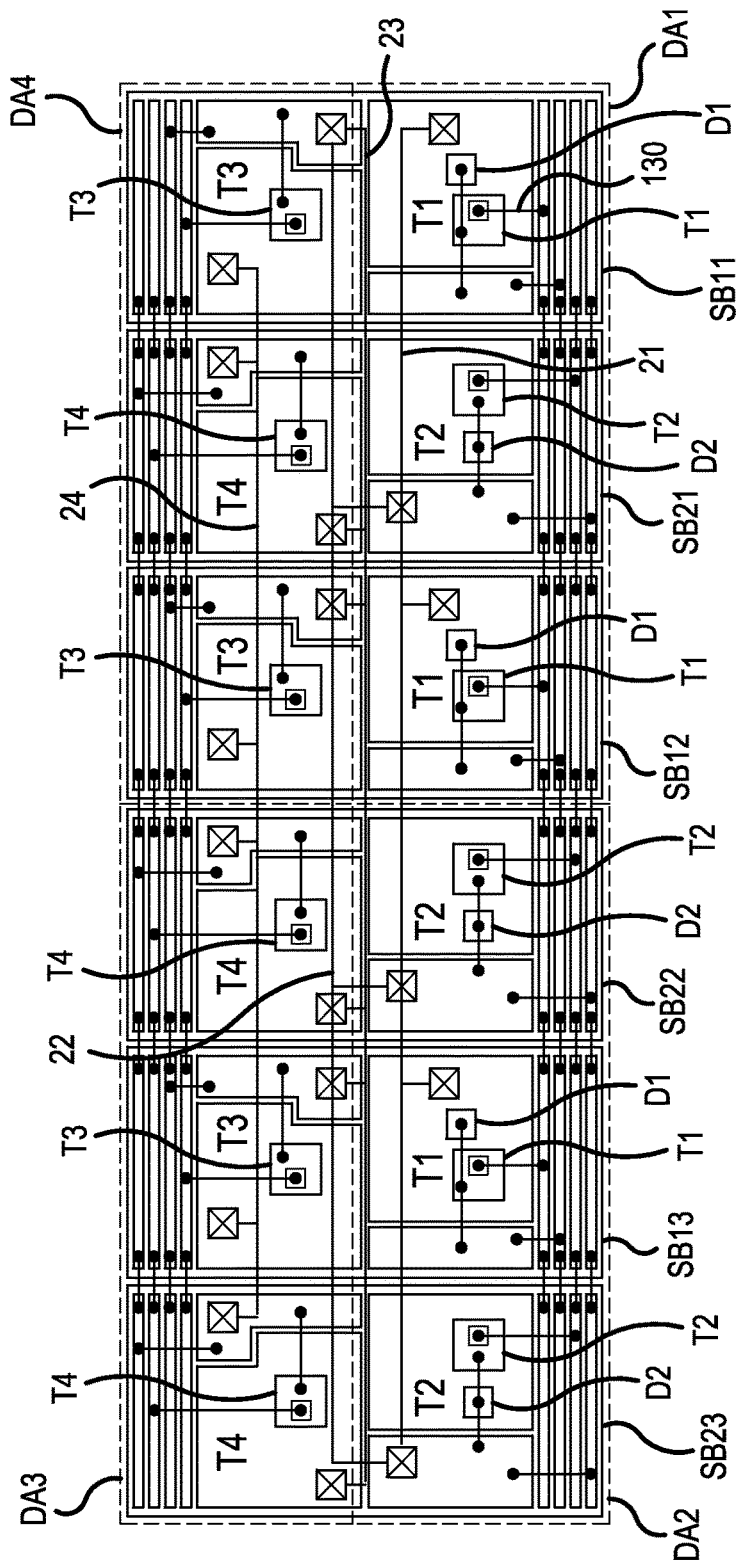
FIG. 21 is a plan view illustrating insulating substrates having semiconductor elements mounted thereon in a semiconductor device according to a fourth embodiment of the invention.

FIG. 21 is a plan view illustrating insulating substrates having semiconductor elements mounted thereon in a semiconductor device according to the fourth embodiment of the invention. The base plate 3 and the first to eleventh auxiliary terminals illustrated in FIG. 2 are not illustrated in FIG. 21.

In the first to third embodiments, three insulating substrates SB11 to SB13 which are the same type and have the insulated gate bipolar transistors T1 and T3 or the insulated gate bipolar transistors T1 and T4 mounted thereon among the four insulated gate bipolar transistors T1 to T4 forming the three-level power conversion circuit are arranged adjacent to each other. Three insulating substrates SB21 to SB23 which are the same type and have the insulated gate bipolar transistors T2 and T4 or the insulated gate bipolar transistors T2 and T3 mounted thereon are arranged adjacent to each other. Among the insulated gate bipolar transistors T1 to T4, the transistors which have the same function and are denoted by the same reference numerals of the same reference letters are arranged adjacent to each other. However, in the fourth embodiment, unlike the first to third embodiments, as illustrated in FIG. 21, the insulating substrates SB11 to SB13 and the insulating substrates SB21 to SB23 are not arranged adjacent to each other, but are alternately arranged in order of the reference numerals of the reference letters from the right side, that is, in order of SB11, SB21, SB12, SB22, SB13, and SB23. Accordingly, the insulated gate bipolar transistors T1 and T2 are not arranged adjacent to each other, but are alternately arranged. The reverse blocking insulated gate bipolar transistors T3 and T4 are not arranged adjacent to each other, but are alternately arranged.

In this case, as illustrated in FIG. 21, the arrangement of the intermediate potential conductor plate 23 and the AC output conductor plate 24 is the same as that in the first embodiment. The positive conductor plate 21 is arranged close to the front surface of the intermediate potential conductor plate 23 over the total length of the intermediate potential conductor plate 23 so as to face the intermediate potential conductor plate 23. The negative conductor plate 22 is arranged close to the rear surface of the intermediate potential conductor plate 23 over the total length of the intermediate potential conductor plate 23 so as to face the intermediate potential conductor plate 23.

Therefore, it is possible to increase the overlap area between the intermediate potential conductor plate 23 and the positive conductor plate 21 to which a current flows in the opposite direction and the overlap area between the intermediate potential conductor plate 23 and the negative conductor plate 22 to which a current flows in the opposite direction, as compared to the first embodiment. As a result, it is possible to improve the effect of reducing inductance.

FIGS. 22A-22D is a diagram schematically illustrating a heat generating state in each operation mode of the semiconductor device according to the fourth embodiment of the invention. In an operation mode in which the insulated gate bipolar transistor T1 is in a switching state and the reverse blocking insulated gate bipolar transistor T4 is recovered, the insulated gate bipolar transistors generate heat in a zigzag pattern, as illustrated in FIG. 22A, which is not described in detail.

In an operation mode in which the insulated gate bipolar transistor T2 is in a switching state and the reverse blocking insulated gate bipolar transistor T3 is recovered, as illustrated in FIG. 22B, the insulated gate bipolar transistors generate heat in a zigzag pattern which is longitudinally reversed with respect to the zigzag pattern illustrated in FIG. 22A.

In an operation mode in which the reverse blocking insulated gate bipolar transistor T3 is in a switching state and the insulated gate bipolar transistor T1 is recovered, as illustrated in FIG. 22C, the insulated gate bipolar transistors alternately generate heat.

Further, in an operation mode in which the reverse blocking insulated gate bipolar transistor T4 is in a switching state and the insulated gate bipolar transistor T2 is recovered, as illustrated in FIG. 22D, heat is generated from two areas of every other insulating substrate which does not generate heat in the mode illustrated in FIG. 22C.

Therefore, in the fourth embodiment, it is possible to reduce inductance in the semiconductor device 1. Heat is not simultaneously generated from the entire base plate 3 of the semiconductor device 1, but the heat generation area is changed depending on the operation mode. Therefore, it is possible to reliably disperse heat and to reliably prevent the semiconductor device 1 from being overheated.

Figure 23:
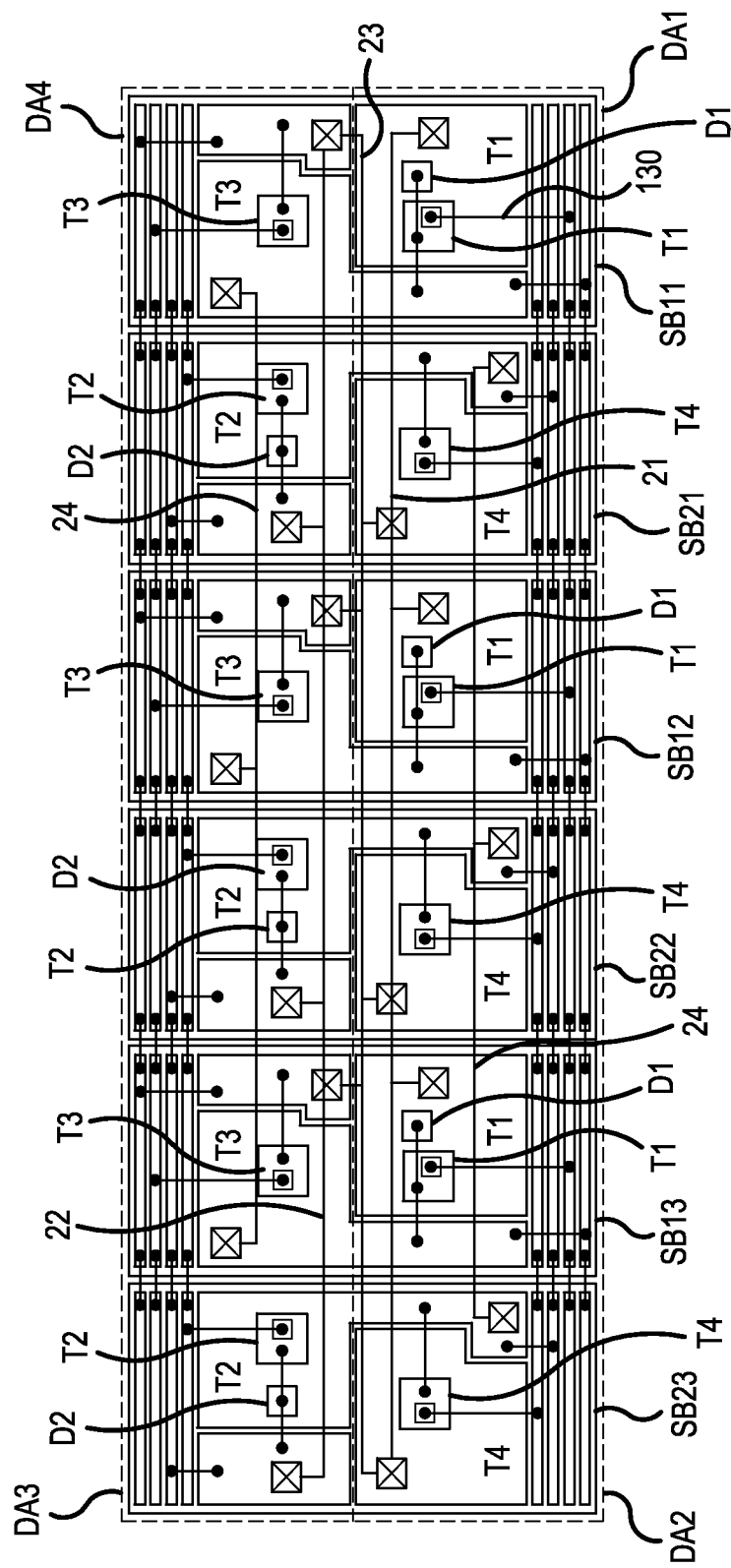
FIG. 23 is a plan view illustrating insulating substrates having semiconductor elements mounted thereon in a modification of the semiconductor device according to the fourth embodiment of the invention.

FIG. 23 is a plan view illustrating insulating substrates having semiconductor elements mounted thereon in a modification of the semiconductor device according to the fourth embodiment of the invention. FIGS. 24A-24D are diagrams schematically illustrating the heat generating state of the semiconductor elements in each operation mode in the modification of the semiconductor device according to the fourth embodiment of the invention.

In the fourth embodiment, as illustrated in FIGS. 23 and 24A-24D, the arrangement in the longitudinal direction of the insulated gate bipolar transistor T2 and the reverse blocking insulated gate bipolar transistor T4 on each of the insulating substrates SB21 to SB23 may be interchanged with each other. In this case, mixtures of the heat generating states in the third embodiment and the heat generating states in the fourth embodiment are obtained as illustrated in FIGS. 24A-24D. Accordingly, it is possible to obtain the same operation and effect as those in the first to fourth embodiments.

In the first to fourth embodiments, description is made for the case in which three sets of the insulating substrates on which the insulated gate bipolar transistors T1 and T2 and the reverse blocking insulated gate bipolar transistors T3 and T4 are mounted are provided. However, the invention is not limited thereto and the number of sets of the insulating substrates may be arbitrarily determined according to the amount of current required.

Figure 25:
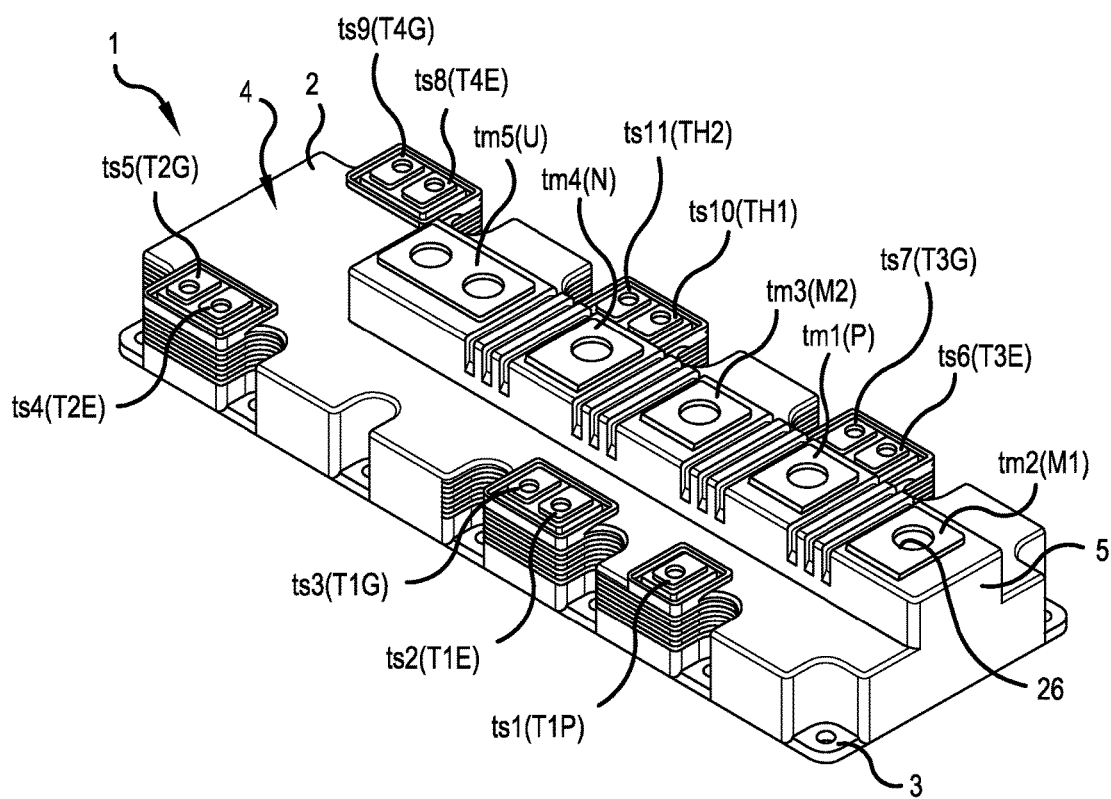
FIG. 25 is a perspective view illustrating a modification of a state in which the arrangement positions of two external connection terminals are interchanged with each other in a semiconductor device corresponding to the semiconductor device according to the first embodiment of the invention illustrated in FIG. 1.

In the first to fourth embodiments, description is made for the case in which the arrangement position of the first to fifth external connection terminals tm1 to tm5 formed on the case 2 is fixed. However, the invention is not limited thereto. FIG. 25 is a perspective view illustrating a modification of the semiconductor device according to the first embodiment of the invention illustrated in FIG. 1, in which the arrangement positions of two external connection terminals are interchanged with each other. That is, as illustrated in FIG. 25, the arrangement positions of the first external connection terminal tm1(P) and the second external connection terminal tm2(M1) may be interchanged with each other.

Figure 26:
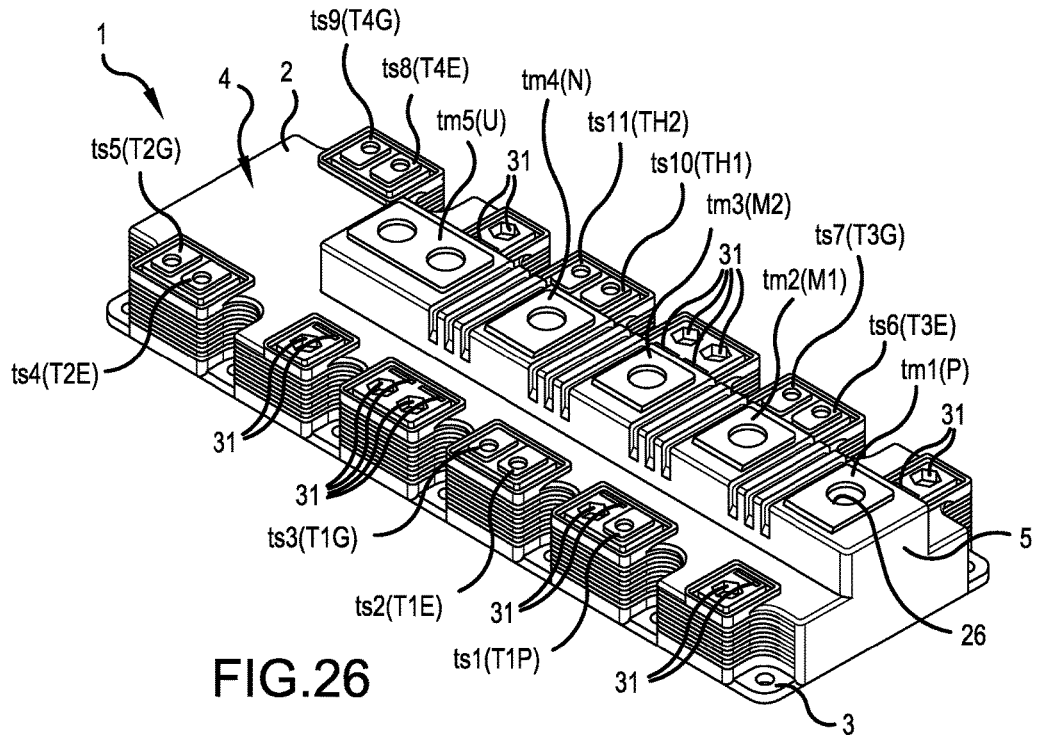
FIG. 26 is a perspective view illustrating another modification of the semiconductor device corresponding to the semiconductor device according to the first embodiment of the invention illustrated in FIG. 1.

In the first to fourth embodiments, description is made for the case in which a necessary number of external connection terminals and auxiliary terminals are provided in the three-level power conversion circuit provided in the case 2. The invention is not limited thereto. FIG. 26 is a plan view illustrating another modification of the semiconductor device according to the first embodiment of the invention illustrated in FIG. 1. That is, as illustrated in FIG. 26, auxiliary terminal forming holes 31 may be formed in areas in which auxiliary terminals other than the first to fifth external connection terminals tm1 to tm5 and the first to eleventh auxiliary terminals ts1 to ts11 can be formed. In this case, it is possible to change the position of the auxiliary terminals or to add the auxiliary terminals, according to the specifications required by the user. Accordingly, it is possible to provide a semiconductor device with high compatibility.

Figure 27:
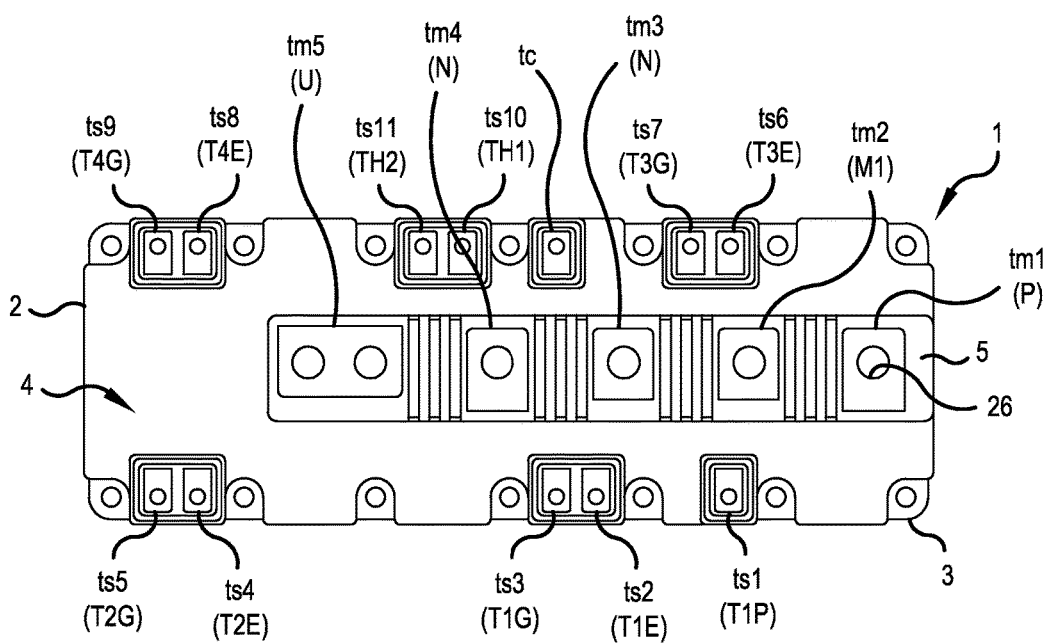
FIG. 27 is a plan view illustrating still another modification of the semiconductor device corresponding to the semiconductor device according to the first embodiment of the invention illustrated in FIG. 1.

In the first to fourth embodiments, description is made for the case in which the three-level power conversion circuit has the structure illustrated in FIG. 12A or FIG. 13A. However, the invention is not limited thereto. That is, the invention can be applied to a three-level power conversion circuit forming the bidirectional switching element disclosed in Patent Document 4 in which the collectors of two insulated gate bipolar transistors that are connected in inverse parallel to the diodes are connected to each other and the two insulated gate bipolar transistors are connected in series to each other. In this case, as described in Patent Document 4, an intermediate terminal for preventing the insulated gate bipolar transistors from being broken due to a large potential difference in the insulating test needs to be provided at a connection point between the collectors of the insulated gate bipolar transistors. FIG. 27 is a perspective view illustrating another modification of the semiconductor device corresponding to the semiconductor device according to the first embodiment of the invention illustrated in FIG. 1. As illustrated in FIG. 27, an intermediate terminal tc is provided on the terminal arrangement surface 4 of the case 2.

In the invention, a desired circuit structure is obtained only by a combination of the connections of the terminals in the semiconductor module. Therefore, the invention is not limited to the application of the above-mentioned power conditioner (power conditioning subsystem: PCS) to the semiconductor device, but can be applied to semiconductor devices of other apparatuses, such as an uninterrupted power supplies (UPS), other power conversion devices, and high-frequency switching ICs.

What is claimed is:

1. A semiconductor device comprising:
    a first insulating substrate on which at least four semiconductor elements forming a three-level power conversion circuit are mounted;
    a base plate on which the first insulating substrate is arranged;
    a positive conductor plate with a positive DC potential that is connected to one semiconductor element among the semiconductor elements;
    a negative conductor plate with a negative DC potential that is connected to another semiconductor element among the semiconductor elements; and
    an intermediate potential conductor plate with an intermediate potential that is connected to the remaining two semiconductor elements among the semiconductor elements,
    wherein the positive conductor plate, the negative conductor plate, and the intermediate potential conductor plate are provided on one surface of the base plate, and
    the positive conductor plate and the negative conductor plate are arranged close to the intermediate potential conductor plate so as to face the intermediate potential conductor plate.

2. The semiconductor device according to claim 1, wherein the negative conductor plate is arranged on an extension line of the positive conductor plate.

3. The semiconductor device according to claim 1, wherein the positive conductor plate, the negative conductor plate, and the intermediate potential conductor plate are vertically provided on the one surface.

4. The semiconductor device according claim 1, further comprising:
a molded body that is made of an insulating resin and covers the semiconductor elements,
wherein a first external connection terminal that is formed on the positive conductor plate, second and third external connection terminals that are formed on the intermediate potential conductor plate, and a fourth external connection terminal that is connected to the negative conductor plate protrude from one surface of the molded body, and
the first external connection terminal, the second and third external connection terminals, and the fourth external connection terminal are arranged on a straight line in parallel in this order.

5. The semiconductor device according to claim 4,
wherein an AC output conductor plate is arranged on a side of the intermediate potential conductor plate which is opposite to the positive conductor plate and the negative conductor plate so as to face the intermediate potential conductor plate, and
a fifth external connection terminal that is formed on the AC output conductor plate is arranged on a side of the fourth external connection terminal which is opposite to the third external connection terminal.

6. The semiconductor device according to claim 4,
wherein the first external connection terminal, the second external connection terminal, the third external connection terminal, and the fourth external connection terminal are linearly arranged in parallel in order of the second external connection terminal, the first external connection terminal, the third external connection terminal, and the fourth external connection terminal.

7. The semiconductor device according claim 4,
wherein the three-level power conversion circuit includes a first insulated gate bipolar transistor having a collector connected to a positive potential of a DC circuit, a second insulated gate bipolar transistor having an emitter connected to a negative potential of the DC circuit, and a bidirectional switching element having one end connected to a connection point between an emitter of the first insulated gate bipolar transistor and a collector of the second insulated gate bipolar transistor,
the intermediate potential conductor plate is connected to the other end of the bidirectional switching element,
the positive conductor plate is connected to the collector of the first insulated gate bipolar transistor, and
the negative conductor plate is connected to the emitter of the second insulated gate bipolar transistor.

8. The semiconductor device according to claim 7,
wherein the bidirectional switching element is an inverse parallel circuit of reverse blocking insulated gate bipolar transistor.

9. The semiconductor device according to claim 7,
wherein a first auxiliary terminal for the gate and emitter of the first insulated gate bipolar transistor and a second auxiliary terminal for the gate and emitter of the second insulated gate bipolar transistor are provided on one of two sides of the semiconductor device which are opposite to each other, with the first to fourth external connection terminals which are arranged on the straight line in parallel interposed therebetween,
a third auxiliary terminal for a gate and an emitter of a third insulated gate bipolar transistor and a fourth auxiliary terminal for a gate and an emitter of a fourth insulated gate bipolar transistor are provided on the other side, and the third auxiliary terminal and the fourth auxiliary terminal have the same arrangement when the three-level power conversion circuit is applied and when another three-level power conversion circuit having a different connection and arrangement structure of the semiconductor elements from the three-level power conversion circuit is applied.

10. The semiconductor device according to claim 9,
wherein another three-level power conversion circuit includes:
a first insulated gate bipolar transistor having a collector connected to the positive potential of the DC circuit;
a second insulated gate bipolar transistor having an emitter connected to the negative potential of the DC circuit;
a third insulated gate bipolar transistor having an emitter connected to the collector of the second insulated gate bipolar transistor;
a fourth insulated gate bipolar transistor having a collector connected to the emitter of the first insulated gate bipolar transistor; and
first and second diodes that are connected in series to each other between a connection point between the collector of the second insulated gate bipolar transistor and the emitter of the third insulated gate bipolar transistor and a connection point between the emitter of the first insulated gate bipolar transistor and the collector of the fourth insulated gate bipolar transistor,
the intermediate potential conductor plate is connected to a connection point between the first and second diodes, wherein
the positive conductor plate is connected to the collector of the first insulated gate bipolar transistor,
the negative conductor plate is connected to the emitter of the second insulated gate bipolar transistor, and
the AC output conductor plate is connected to a connection point between an emitter of the fourth insulated gate bipolar transistor and a collector of the third insulated gate bipolar transistor.

11. The semiconductor device according to claim 9,
wherein a plurality of auxiliary terminal forming holes through which the first to fourth auxiliary terminals lead to the outside are formed in the molded body such that the first to fourth auxiliary terminals can be selected according to the connection or arrangement of the semiconductor elements of the provided three-level power conversion circuit and can lead to the outside.

12. The semiconductor device according to claim 8,
wherein the first insulating substrate which is arranged on the base plate includes a second insulating plate that has a rectangular shape in a plan view and a third insulating plate that has a rectangular shape in a plan view,
the second insulating plate includes the reverse blocking insulated gate bipolar transistor that is arranged one side of the rectangular shape in a longitudinal direction and the first insulated gate bipolar transistor and a first diode that are arranged on the other side of the rectangular shape in the longitudinal direction,
the third insulating plate includes the reverse blocking insulated gate bipolar transistor that is arranged one side of the rectangular shape in the longitudinal direction and the second insulated gate bipolar transistor and a second diode that are arranged on the other side of the rectangular shape in the longitudinal direction, a plurality of the second insulating substrates are arranged such that the one side and the other side are adjacent to each other, a plurality of the third insulating substrates are arranged such that the one side and the other side are adjacent to each other, the one side of each of the plurality of second insulating substrates is adjacent to the one side of each of the plurality of third insulating substrates, and the other sides of the plurality of second insulating substrates are adjacent to the other sides of the plurality of third insulating substrates.

13. The semiconductor device according to claim 12, wherein the positive conductor plate is connected to the collectors of the first insulated gate bipolar transistors and cathodes of the first diodes on the plurality of second insulating substrates;

the negative conductor plate is connected to the emitters of the second insulated gate bipolar transistors and anodes of the second diodes on the plurality of third insulating substrates;

the intermediate potential conductor plate is connected to the emitters of the reverse blocking insulated gate bipolar transistors on the plurality of second insulating substrates and the collectors of the reverse blocking insulated gate bipolar transistors on the plurality of third insulating substrates; and the AC output conductor plate is connected to the collectors of the reverse blocking insulated gate bipolar transistors on the plurality of second insulating substrates, the collectors of the second insulated gate bipolar transistors on the plurality of third insulating substrates, cathodes of the second diodes on the plurality of third insulating substrates, and the emitters of the reverse blocking insulated gate bipolar transistors on the plurality of third insulating substrates.

14. The semiconductor device according to claim 13, wherein the negative conductor plate is arranged on an extension line of the positive conductor plate, the intermediate potential conductor plate is arranged between the positive and negative conductor plates and the AC output conductor plate, and the intermediate potential conductor plate is arranged closer to the reverse blocking insulated gate bipolar transistors than the positive conductor plate and the negative conductor plate.

15. The semiconductor device according to claim 12, wherein the plurality of second insulating substrates are connected in parallel to each other.

16. The semiconductor device according to claim 12, wherein the plurality of third insulating substrates are connected in parallel to each other.

17. The semiconductor device according to claim 12, wherein the first insulated gate bipolar transistor and the first diode on the second insulating substrate are connected in parallel to each other.

18. The semiconductor device according to claim 12, wherein the second insulated gate bipolar transistor and the second diode on the third insulating substrate are connected in parallel to each other.

19. The semiconductor device according to claim 13, wherein the negative conductor plate is connected to the emitters of the second insulated gate bipolar transistors and the anodes of the second diodes on the plurality of third insulating substrates by bonding wires, the intermediate potential conductor plate is connected to the emitters of the reverse blocking insulated gate bipolar transistors on the plurality of second insulating substrates by bonding wires, and the AC output conductor plate is connected to the emitters of the reverse blocking insulated gate bipolar transistors on the plurality of third insulating substrates by bonding wires.

\* \* \* \* \*